(12) United States Patent
Lin et al.

(10) Patent No.: US 12,205,632 B2
(45) Date of Patent: Jan. 21, 2025

(54) MEMORY CELL AND METHOD OF OPERATING THE SAME

(71) Applicant: TAIWAN SEMICONDUCTOR MANUFACTURING COMPANY, LTD., Hsinchu (TW)

(72) Inventors: Hon-Jarn Lin, Hsinchu (TW); Chia-Fu Lee, Hsinchu (TW); Yi-Chun Shih, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 62 days.

(21) Appl. No.: 17/586,585

(22) Filed: Jan. 27, 2022

(65) Prior Publication Data

US 2023/0127502 A1    Apr. 27, 2023

Related U.S. Application Data

(60) Provisional application No. 63/271,559, filed on Oct. 25, 2021.

(51) Int. Cl.
| | |
|---|---|
| G11C 7/00 | (2006.01) |
| G11C 11/4072 | (2006.01) |
| G11C 11/4074 | (2006.01) |
| G11C 11/408 | (2006.01) |
| G11C 11/4094 | (2006.01) |
| G11C 11/4099 | (2006.01) |

(52) U.S. Cl.
CPC ...... *G11C 11/4099* (2013.01); *G11C 11/4072* (2013.01); *G11C 11/4074* (2013.01); *G11C 11/4085* (2013.01); *G11C 11/4094* (2013.01)

(58) Field of Classification Search
CPC ... G11C 7/1051; G11C 7/1071; G11C 7/1006; G11C 7/22
USPC ........................................ 365/189.14, 189.15
See application file for complete search history.

(56) References Cited

U.S. PATENT DOCUMENTS

| | | | |
|---|---|---|---|
| 8,625,373 B2* | 1/2014 | Schreiber | G11C 7/065 365/205 |
| 9,876,499 B2* | 1/2018 | Kozuma | H03K 19/0948 |
| 10,381,071 B1 | 8/2019 | Si et al. | |
| 2019/0088309 A1 | 3/2019 | Li et al. | |
| 2021/0263672 A1 | 8/2021 | Chang et al. | |
| 2021/0271597 A1 | 9/2021 | Verma et al. | |

* cited by examiner

*Primary Examiner* — Son T Dinh
(74) *Attorney, Agent, or Firm* — Hauptman Ham, LLP

(57) ABSTRACT

A memory cell includes a memory circuit and a multiplier circuit. The multiplier circuit includes an output node configured to output the output signal, a first transistor and an initialization circuit. The first transistor is coupled to the output node and the memory circuit, and is configured to receive at least the second signal. The initialization circuit is coupled to the first transistor by the output node, and is configured to initialize the multiplier circuit in response to at least a third signal or a fourth signal. The memory circuit is configured to store a first value of a first signal of a first storage node. The multiplier circuit is coupled to the memory circuit. The multiplier circuit is configured to generate an output signal in response to the first signal and a second signal. The output signal corresponds to a product of the first signal and the second signal.

20 Claims, 9 Drawing Sheets

| | Weight (Q) | | |
|---|---|---|---|
| DIN | "1" | "0" | |
| "1" | CASE A, Dout=1 | CASE C, Dout=0 | Row1 |
| "0" | CASE B, Dout=0 | CASE D, Dout=0 | Row2 |
| Column 1 | Column 2 | Column 3 | |

MEMORY CELL AND METHOD OF OPERATING THE SAME

PRIORITY CLAIM

This application claims the benefit of U.S. Provisional Application No. 63/271,559, filed Oct. 25, 2021, which is herein incorporated by reference in its entirety.

BACKGROUND

Recent developments in the field of artificial intelligence have resulted in various products and/or applications, including, but not limited to, speech recognition, image processing, machine learning, natural language processing, or the like. Such products and/or applications often use neural networks to process large amounts of data for learning, training, cognitive computing, or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
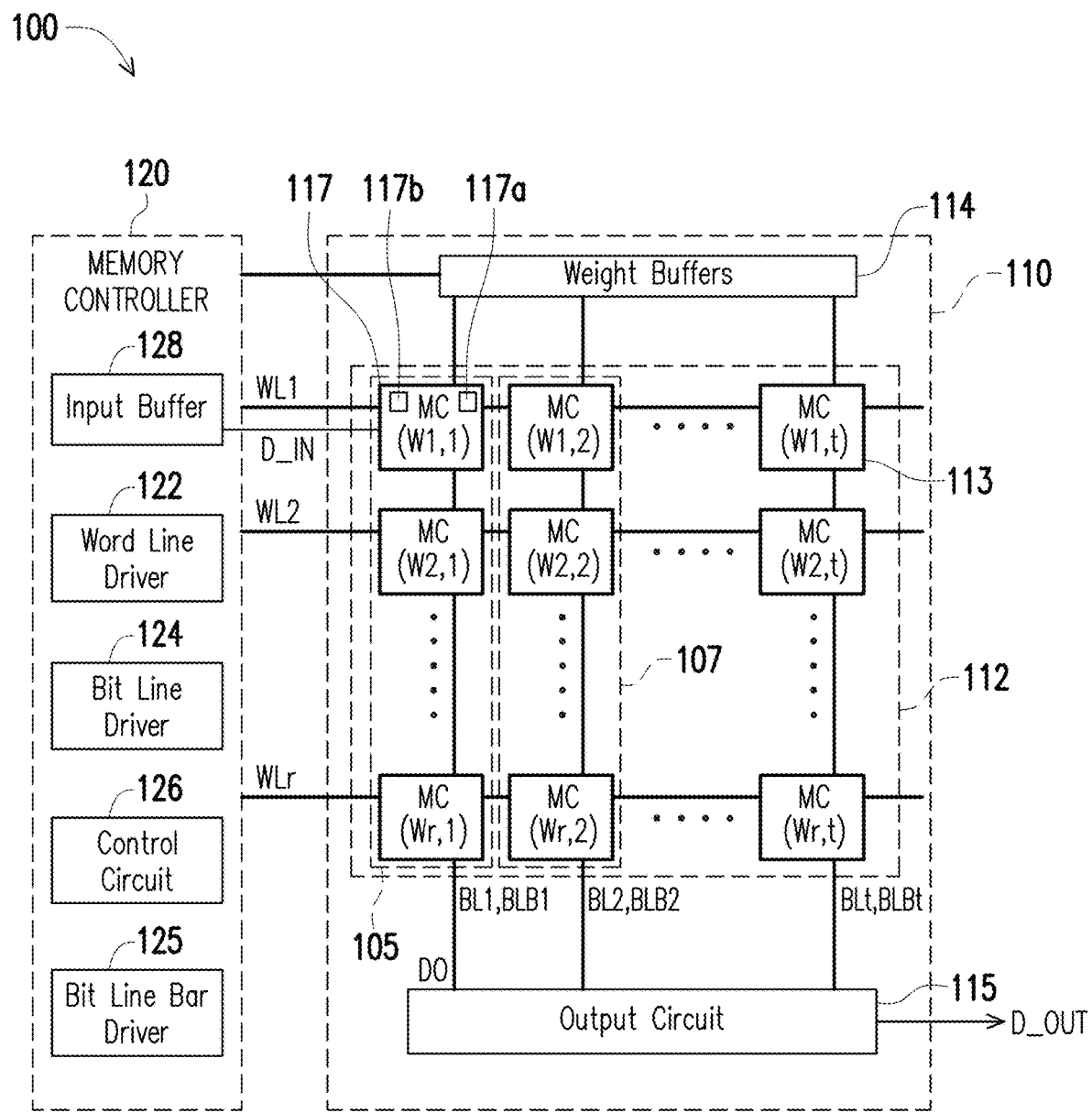
FIG. 1 is a block diagram of a memory device, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory cell array includes a plurality of memory cells. In some embodiments, each memory cell of the plurality of memory cells includes a memory circuit and a multiplier circuit.

In some embodiments, the multiplier circuit is coupled to the memory circuit.

In some embodiments, the memory circuit is configured to store a first value of a first signal of a first storage node.

In some embodiments, the multiplier circuit is configured to generate an output signal in response to the first signal and a second signal. In some embodiments, the output signal corresponds to a product of the first signal and the second signal. In some embodiments, the output signal is generated by a computing-in-memory (CIM) operation between the first signal and the second signal.

In some embodiments, the multiplier circuit includes an output node configured to output the output signal, a first transistor and an initialization circuit.

In some embodiments, the first transistor is coupled to the output node and the memory circuit. In some embodiments, the first transistor is configured to receive at least the second signal.

In some embodiments, the initialization circuit is coupled to the first transistor by the output node. In some embodiments, the initialization circuit is configured to initialize the multiplier circuit in response to at least a third signal or a fourth signal.

In some embodiments, the memory cell array is part of a CIM macro configured to perform CIM operations usable in neural network applications, as well as other applications. In some embodiments, the inclusion of the multiplier circuit within each memory cell in the memory cell array makes it possible to reduce the number of transistors in the multiplier circuit of the CIM macro thereby reducing the size of the CIM macro compared to other approaches.

FIG. 1 is a block diagram of a memory device 100, in accordance with some embodiments. A memory device is a type of an integrated circuit (IC) device. In at least one embodiment, a memory device is an individual IC device. In some embodiments, a memory device is included as a part of a larger IC device which comprises circuitry other than the memory device for other functionalities.

The memory device 100 comprises a memory macro 110 and a memory controller 120. The memory macro 110 comprises a memory array 112, one or more weight buffers 114, and an output circuit 115. The memory controller 120 comprises a word line driver 122, a bit line driver 124, a bit line bar driver 125, a control circuit 126, and an input buffer

128. In some embodiments, one or more elements of the memory controller 120 are included in the memory macro 110, and/or one or more elements (except the memory array 112) of the memory macro 110 are included in the memory controller 120.

A macro has a reusable configuration and is usable in various types or designs of IC devices. In some embodiments, the macro is understood in the context of an analogy to the architectural hierarchy of modular programming in which subroutines/procedures are called by a main program (or by other subroutines) to carry out a given computational function. In this context, an IC device uses the macro to perform one or more given functions. Accordingly, in this context and in terms of architectural hierarchy, the IC device is analogous to the main program and the macro is analogous to subroutines/procedures. In some embodiments, the macro is a soft macro. In some embodiments, the macro is a hard macro. In some embodiments, the macro is a soft macro which is described digitally in register-transfer level (RTL) code. In some embodiments, synthesis, placement and routing have been performed on the macro such that the soft macro can be synthesized, placed and routed for a variety of process nodes. In some embodiments, the macro is a hard macro which is described digitally in a binary file format (e.g., Graphic Database System II (GDSII) stream format), where the binary file format represents planar geometric shapes, text labels, other information and the like of one or more layout-diagrams of the macro in hierarchical form. In some embodiments, synthesis, placement and routing have been performed on the macro such that the hard macro is specific to a particular process node.

A memory macro is a macro comprising memory cells which are addressable to permit data to be written to or read from the memory cells. In some embodiments, a memory macro further comprises circuitry configured to provide access to the memory cells and/or to perform a further function associated with the memory cells. For example, the memory macro 110 comprises memory cells MC, as described herein, that form circuitry configured to provide a CIM function associated with the memory cells MC. In at least one embodiment, a memory macro configured to provide a CIM function is referred to as a CIM macro. The described macro configuration is an example. Other configurations are within the scopes of various embodiments.

The memory cells MC of the memory macro 110 are arranged in a plurality of columns and rows of the memory array 112. The memory controller 120 is electrically coupled to the memory cells MC and configured to control operations of the memory cells MC including, but not limited to, a read operation, a write operation, or the like.

The memory array 112 further comprises a plurality of word lines (also referred to as "address lines") WL1 to WLr extending along the rows, a plurality of bit lines (also referred to as "data lines") BL1 to BLt extending along the columns of the memory cells MC, and a plurality of bit line bars (also referred to as "data line bars") BLB1 to BLBt extending along the columns of the memory cells MC, where r and t are natural numbers. Each of the memory cells MC is electrically coupled to the memory controller 120 by at least one of the word lines, at least one of the bit lines and at least one of the bit line bars. In some example operations, word lines are configured for transmitting addresses of the memory cells MC to be read from, or for transmitting addresses of the memory cells MC to be written to, or the like. In at least one embodiment, a set of word lines is configured to perform as both read word lines and write word lines. In some embodiments, bit lines and bit line bars are used for transmitting data read from or written to the memory cells MC indicated by corresponding word lines, or the like.

In some embodiments, read bit lines and/or read bit line bars are configured for transmitting data read from the memory cells MC indicated by corresponding word lines, and write bit lines and/or write bit line bars are configured for transmitting data to be written to the memory cells MC indicated by corresponding word lines, or the like.

The word lines are commonly referred to herein as WL, the bit lines are commonly referred to herein as BL, and the bit line bars are referred to herein as BLB. Various numbers of word lines, bit lines and/or bit line bars in the memory array 112 are within the scope of various embodiments. Example memory types of the memory cells MC include, but are not limited to, static random-access memory (SRAM), resistive RAM (RRAM), magnetoresistive RAM (MRAM), phase change RAM (PCRAM), spin transfer torque RAM (STTRAM), floating-gate metal-oxide-semiconductor field-effect transistors (FGMOS), spintronics, or the like. In one or more example embodiments described herein, the memory cells MC include SRAM memory cells.

In the example configuration in FIG. 1, the memory cells MC are single-port memory cells. In some embodiments, a port of a memory cell is represented by a set of a word line WL and a bit line BL/bit line bar BLB (referred to herein as a WL/BL/BLB set) which are configured to provide access to the memory cell in a read operation (i.e., read access) and/or in a write operation (i.e., write access). A single-port memory cell has one WL/BL/BLB set which is configured for both read access and write access, but not at the same time. A multi-port memory cell has several WL/BL/BLB sets each of which is configured for read access only, or for write access only, or for both read access and write access. Examples of single-port memory cells are described with respect to FIGS. 1, 3, 4, 5A-5E, 6 and 7A-7B. Other configurations or other number of ports for memory cells in memory array 112 are within the scope of the present disclosure. For example, in some embodiments, one or more single-port memory cells that are described with respect to FIGS. 1, 3, 4, 5A-5E, 6 and 7A-7B can be replaced with a corresponding multi-port memory cell.

The memory array 112 comprises a plurality of memory segments. In some embodiments, a memory segment comprises a memory row, a memory column, a memory bank, or the like. A memory row comprises a plurality of memory cells coupled to the same word line WL. A memory column (also referred to as "memory string") comprises a plurality of memory cells coupled to the same bit line BL and the same bit line bar BLB. A memory bank comprises more than one memory rows and/or more than one memory columns. In at least one embodiment, a memory bank comprises a section of the memory array 112 with multiple memory rows and multiple memory columns. In some embodiments, a memory segment comprises multiple memory banks. In an example, a first memory segment 105 includes a memory column of memory cells MC coupled to the bit line BL1 and bit line bar BLB1, a second memory segment 107 includes a memory column of memory cells MC coupled to the bit line BL2 and bit line bar BLB2, or the like. Other manners of dividing the memory array 112 into a plurality of memory segments are within the scopes of various embodiments.

Each of the memory cells MC includes a storage portion 117a (shown only in memory cell 117 for ease of illustration) and a computation portion 117b (shown only in memory cell 117 for ease of illustration). Each of the memory cells MC is configured to store a piece of weight data W, and is configured to perform a CIM operation on the piece of weight data W and a piece of received data D_IN. Each storage portion 117a corresponds to each computation portion 117b.

Each storage portion 117a of the memory cells MC is configured to store a piece of weight data W, and each computation portion 117b of the memory cells MC is configured to perform a CIM operation on the piece of weight data W and a piece of received data D_IN.

In one or more example embodiments described herein, the memory cells MC are single-bit memory cells, i.e., each memory cell is configured to store a bit of weight data W and to compute a corresponding bit of an output signal Dout based on a CIM operation of the bit of weight data W and a bit of received data D_IN. This is an example, and multi-bit memory cells, each of which is configured to store more than one bit of weight data W and to perform a corresponding CIM operation on the corresponding multi-bit pieces of weight data W, are within the scopes of various embodiments. In some embodiments, a single-bit memory cell is also referred to as a bitcell. For example, the memory cell 113 coupled to the word line WL1, the bit line BLt and the bit line bar BLBt is configured to store a piece W1,t of the weight data, and to perform a CIM operation on the piece W1,t of the weight data W and a corresponding received input data of received input data D_IN. A combination of multiple pieces of weight data W stored in multiple memory cells constitutes a weight value to be used in a CIM operation. For simplicity, a piece of weight data stored in a memory cell MC, multiple pieces of weight data stored in multiple memory cells MC, or all pieces of weight data stored in all memory cells MC of the memory array 112 are referred to herein as weight data W.

Each computation portion 117b of the memory cells MC is coupled to the outputs of the input buffer 128, and is configured to receive input data D_IN. In the example configuration in FIG. 1, the input data D_IN are supplied from the input buffer 128 in the memory controller 120. In one or more embodiments, the input data D_IN are output data (e.g., output data D_OUT) supplied from another memory macro (not shown) of the memory device 100. In some embodiments, the input data D_IN are serially supplied to the computation portion 117b in the form of a stream of bits, as described herein.

The computation portion 117b of the memory cells MC is configured to, based on the input data D_IN from the input buffer 128, generate output data DO corresponding to a CIM operation performed on the input data D_IN and the weight data W read from one or more of the memory cells MC. Examples of CIM operations include, but are not limited to, mathematical operations, logical operations, combination thereof, or the like. In at least one embodiment, the computation portion 117b comprises a Multiply Accumulate (MAC) circuit, and the CIM operation comprises a multiplication of one or more multibit weight values with one or more multibit input data values. Further computation portions or circuits configured to perform CIM operations other than a multiplication are within the scopes of various embodiments. The output data DO are supplied, as input data, to the output circuit 115.

The weight buffers 114 are coupled to the memory array 112, and configured to temporarily hold new weight data to be updated in the memory array 112. In some embodiments, the weight buffers 114 are located outside of memory macro 110. In some embodiments as described herein, each memory segment is coupled to a corresponding weight buffer. In one or more embodiments as described herein, a common weight buffer is coupled to several memory segments. The weight buffers 114 are coupled to the memory cells MC in the memory array 112 via the bit lines BL and bit line bars BLB. In a weight data updating operation, the new weight data are written into one or more memory cells MC from the weight buffers 114 and via the corresponding bit lines BL and corresponding bit line bars BLB. As schematically illustrated in FIG. 1, the weight buffers 114 are coupled to the memory controller 120 to receive the new weight data and/or control signals that specify when and/or in which memory cells MC the new weight data are to be updated. In at least one embodiment, the new weight data are received from external circuitry outside the memory device 100, for example, a processor as described herein. The new weight data are received through one or more input/output (I/O) circuits (not shown) of the memory controller 120, and are forwarded to the weight buffers 114. Example weight buffers include, but are not limited to, registers, memory cells, or other circuit elements configured for data storage.

The output circuit 115 have inputs coupled to the bit lines BL/bit line bars BLB to receive the output data DO from one or more of the memory cells MC. The output circuit 115 is configured to latch the output data DO from the memory array 112 received from the bit lines BL/bit line bars BLB, and to supply the output signal D_OUT on an output of the output circuit 115. Examples of the output circuit 115 include registers, flip-flops, latches, or the like.

In some embodiments, the output data D_OUT are supplied, as input data, to another memory macro (not shown) of the memory device 100. In one or more embodiments, the output data D_OUT are output, through one or more I/O circuits (not shown) of the memory controller 120, to external circuitry outside the memory device 100, for example, a processor as described herein.

In the example configuration in FIG. 1, the controller 120 comprises the word line driver 122, the bit line driver 124, the bit line bar driver 125, the control circuit 126, and the input buffer 128. In at least one embodiment, the controller 120 further includes one or more clock generators for providing clock signals for various components of the memory device 100, one or more input/output (I/O) circuits for data exchange with external devices, and/or one or more controllers for controlling various operations in the memory device 100.

The word line driver 122 is coupled to the memory array 112 via the word lines WL. The word line driver 122 is configured to decode a row address of the memory cell MC selected to be accessed in a read operation or a write operation. The word line driver 122 is configured to supply a voltage to the selected word line WL corresponding to the decoded row address, and a different voltage to the other, unselected word lines WL.

The bit line driver 124 is coupled to the memory array 112 via the bit lines BL. The bit line driver 124 is configured to decode a column address of the memory cell MC selected to be accessed in a read operation or a write operation. The bit line driver 124 is configured to supply a voltage to the selected bit line BL corresponding to the decoded column address, and a different voltage to the other, unselected bit lines BL.

The bit line bar driver 125 is coupled to the memory array 112 via the bit line bars BLB. The bit line bar driver 125 is configured to decode a column address of the memory cell MC selected to be accessed in a read operation or a write operation. The bit line bar driver 125 is configured to supply a voltage to the selected bit line bar BLB corresponding to the decoded column address, and a different voltage to the other, unselected bit line bars BLB.

The control circuit 126 is coupled to one or more of the memory cells MC, the weight buffers 114, output circuit 115, word line driver 122, bit line driver 124, bit line bar driver 125, input buffer 128 to coordinate operations of these circuits, drivers and/or buffers in the overall operation of the memory device 100. For example, the control circuit 126 is configured to generate various control signals for controlling operations of one or more of the memory cells MC, the weight buffers 114, output circuit 115, word line driver 122, bit line driver 124, bit line bar driver 125, input buffer 128.

The input buffer 128 is configured to receive the input data from external circuitry outside the memory device 100, for example, a processor as described herein. The input data are received through one or more I/O circuits (not shown) of the memory controller 120, and are forwarded via the input buffer 128 to the memory array 112. Example input buffers include, but are not limited to, registers, memory cells, or other circuit elements configured for data storage.

In at least one embodiment, CIM memory devices, such as the memory device 100, are advantageous over other approaches, where data are moved back and forth between the memory and a processor, because such back-and-forth data movement, which is a bottleneck to both performance and energy efficiency, is avoidable. Examples of CIM applications include, but are not limited to, artificial intelligence, image recognition, neural network for machine learning, or the like. In some embodiments, the memory device 100 makes it possible to simultaneously perform weight data updating and CIM operations, in one or more embodiments.

Each of the memory cells MC includes a storage portion 117a (shown only in memory cell 117 for ease of illustration) and a computation portion 117b (shown only in memory cell 117 for ease of illustration). Each of the memory cells MC is configured to store a piece of weight data W, and is configured to perform a CIM operation on the piece of weight data W and a piece of received data D_IN.

Each storage portion 117a of the memory cells MC is configured to store a piece of weight data W, and each computation portion 117b of the memory cells MC is configured to perform a CIM operation on the piece of weight data W and a piece of received data D_IN.

In some embodiments, the inclusion of a computation portion 117b within each memory cell MC in memory array 112 makes it possible to reduce the number of transistors in the computation portion 117b of the CIM macro thereby reducing the size of the memory macro 110 compared to other approaches.

In some embodiments, the inclusion of a computation portion 117b within each memory cell MC in memory array 112 makes it possible to reduce the distance between the computation portion 117b and the storage portion 117a of each memory cell MC in the CIM macro thereby reducing the data loss or decay between the computation portion 117b and the storage portion 117a of the memory array 112 compared to other approaches.

In some embodiments, the inclusion of a computation portion 117b within each memory cell MC in memory array 112 makes it possible for the input data DIN to be transmitted by less number of transistor devices in the computation portion 117b of the CIM macro thereby reducing the delay associated with logic devices of other approaches that have a greater number of transistors than the present disclosure.

As a result, in at least one embodiment, it is possible to achieve one or more advantages including, but not limited to, reduced processing time, reduced power consumption, reduced chip area, lowered manufacturing cost, improved performance, or the like.

Figure 2A:
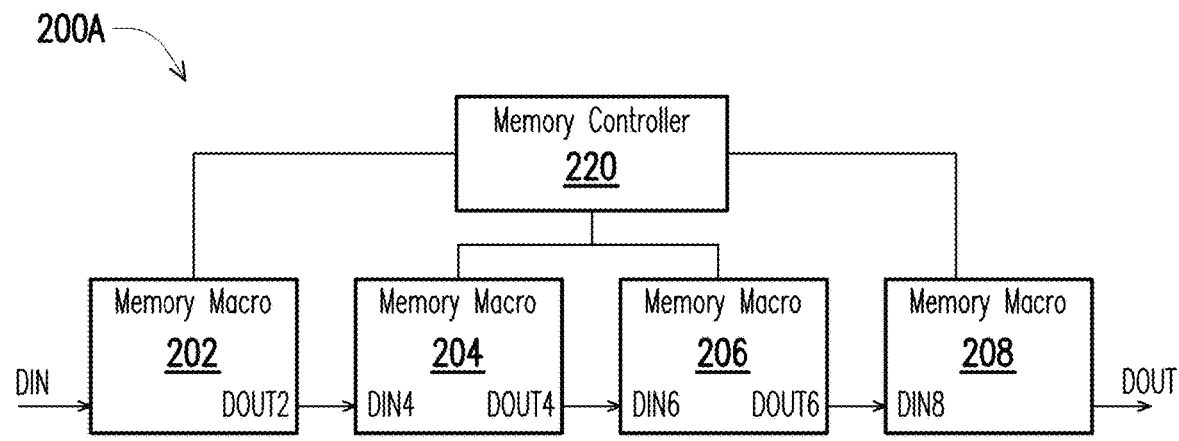
FIG. 2A is a schematic diagram of a memory device, in accordance with some embodiments.

FIG. 2A is a schematic diagram of a memory device 200A, in accordance with some embodiments.

The memory device 200A comprises memory macros 202, 204, 206, 208 and memory controller 220. In some embodiments, one or more of the memory macros 202, 204, 206, 208 correspond to memory macro 110, and/or memory controller 220 corresponds to the memory controller 120. In the example configuration in FIG. 2A, the memory controller 220 is a common memory controller for the memory macros 202, 204, 206, 208. In at least one embodiment, at least one of the memory macros 202, 204, 206, 208 has its own memory controller. The number of four memory macros in the memory device 200A is an example. Other configurations are within the scopes of various embodiments.

The memory macros 202, 204, 206, 208 are coupled to each other in sequence, with output data of a preceding memory macro being input data for a subsequent memory macro. For example, input data DIN are input into the memory macro 202. The memory macro 202 performs one or more CIM operations based on the input data DIN and weight data W (shown in FIG. 1) stored in the memory macro 202, and generates output data DOUT2 as results of the CIM operations. The output data DOUT2 are supplied as input data DIN4 of the memory macro 204. The memory macro 204 performs one or more CIM operations based on the input data DIN4 and weight data W stored in the memory macro 204, and generates output data DOUT4 as results of the CIM operations. The output data DOUT4 are supplied as input data DIN6 of the memory macro 206. The memory macro 206 performs one or more CIM operations based on the input data DIN6 and weight data W stored in the memory macro 206, and generates output data DOUT6 as results of the CIM operations. The output data DOUT6 are supplied as input data DIN8 of the memory macro 208. The memory macro 208 performs one or more CIM operations based on the input data DIN8 and weight data W stored in the memory macro 208, and generates output data DOUT as results of the CIM operations. One or more of the input data DIN, DIN4, DIN6, DIN8 correspond to the input data D_IN described with respect to FIG. 1, and/or one or more of the output data DOUT2, DOUT4, DOUT6, DOUT correspond to the output data D_OUT described with respect to FIG. 1, and similar detailed description is therefore omitted. In at least one embodiment, the described configuration of the memory macros 202, 204, 206, 208 implements a neural network. In at least one embodiment, one or more advantages described herein are achievable by the memory device 200A.

Figure 2B:
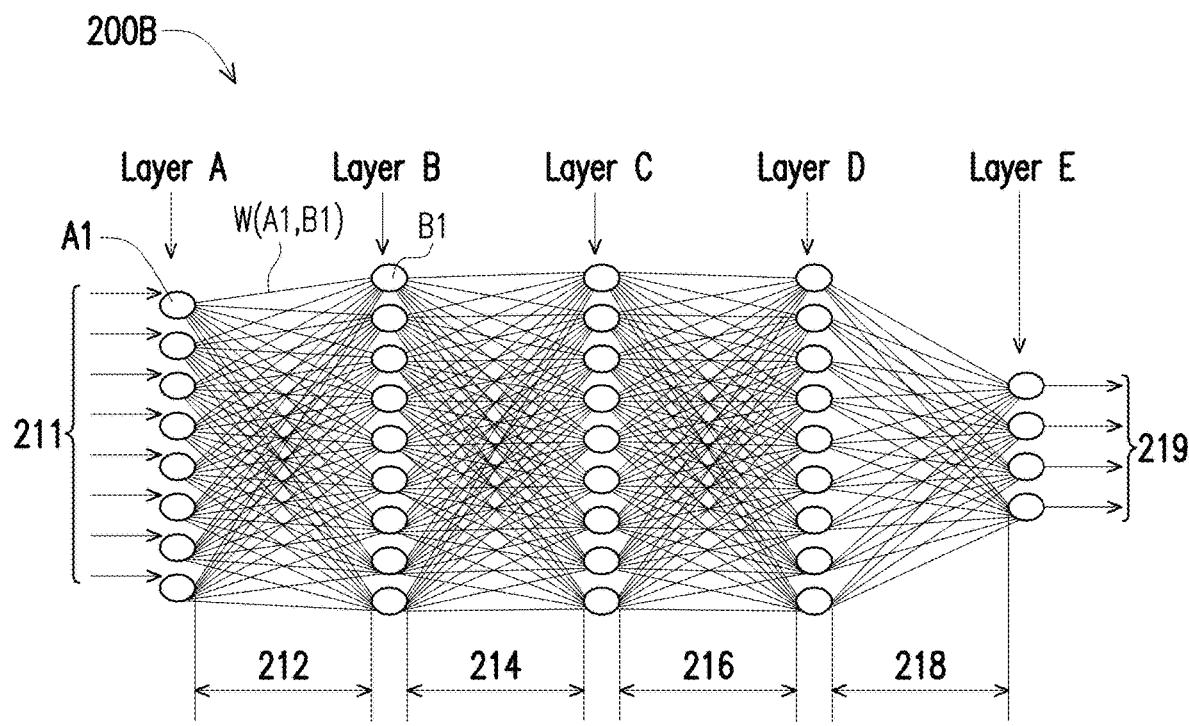
FIG. 2B is a schematic diagram of a neural network, in accordance with some embodiments.

FIG. 2B is a schematic diagram of a neural network 200B, in accordance with some embodiments.

The neural network 200B comprises a plurality of layers A-E each comprising a plurality of nodes (or neurons). The nodes in successive layers of the neural network 200B are connected with each other by a matrix or array of connections. For example, the nodes in layers A and B are connected with each other by connections in a matrix 212, the nodes in layers B and C are connected with each other by connections in a matrix 214, the nodes in layers C and D are connected with each other by connections in a matrix 216, and the nodes in layers D and E are connected with each other by connections in a matrix 218. Layer A is an input layer configured to receive input data 211. The input data 211 propagate through the neural network 200B, from one layer to the next layer via the corresponding matrix of connections between the layers. As the data propagate through the neural network 200B, the data undergo one or more computations, and are output as output data 219 from layer E which is an output layer of the neural network 200B. Layers B, C, D between input layer A and output layer E are sometimes referred to as hidden or intermediate layers. The number of layers, number of matrices of connections, and number of nodes in each layer in FIG. 2B are examples. Other configurations are within the scopes of various embodiments. For example, in at least one embodiment, the neural network 200B includes no hidden layer, and has an input layer connected by one matrix of connections to an output layer. In one or more embodiments, the neural network 200B has one, two, or more than three hidden layers.

In some embodiments, the matrices 212, 214, 216, 218 are correspondingly implemented by the memory macros 202, 204, 206, 208, the input data 211 correspond to the input data DIN, and the output data 219 correspond to the output data DOUT, and similar detailed description is therefore omitted. Specifically, in the matrix 212, a connection between a node in layer A and another node in layer B has a corresponding weight. For example, a connection between node A1 and node B1 has a weight W(A1,B1) which corresponds to a weight value stored in the memory array of the memory macro 202. The memory macros 204, 206, 208 are configured in a similar manner. The weight data W in one or more of the memory macros 202, 204, 206, 208 are updated, e.g., by a processor and through the memory controller 220, as machine learning is performed using the neural network 200B. One or more advantages described herein are achievable in the neural network 200B implemented in whole or in part by one or more memory macros and/or memory devices in accordance with some embodiments.

Figure 2C:
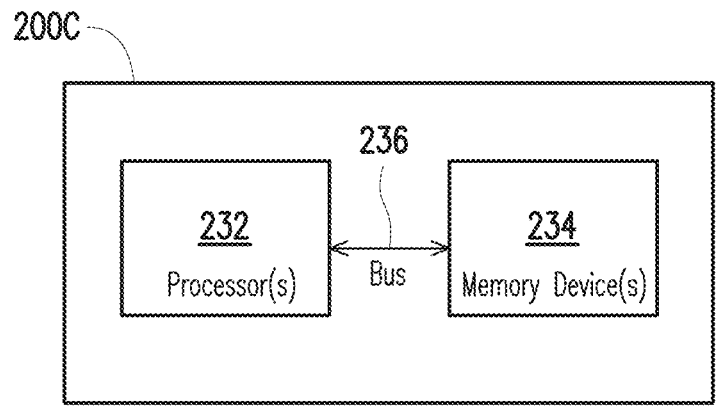
FIG. 2C is a schematic diagram of an integrated circuit (IC) device, in accordance with some embodiments.

FIG. 2C is a schematic diagram of an integrated circuit (IC) device 200C, in accordance with some embodiments.

The IC device 200C is an embodiment of memory device 100 of FIG. 1 or memory device 200A of FIG. 2A, and similar detailed description is therefore omitted.

The IC device 200C comprises one or more hardware processors 232, and one or more memory devices 234 coupled to the processors 232 by one or more buses 236. In some embodiments, the one or more hardware processors 232 is useable as one or more components in controller 120 of FIG. 1 or memory controller 220 in FIG. 2A, and similar detailed description is therefore omitted. In some embodiments, the one or more memory devices 234 is useable as one or more components in memory macro 110 of FIG. 1 or one or more of memory macros 202, 204, 206 or 208 in FIG. 2A, and similar detailed description is therefore omitted.

In some embodiments, the IC device 200C comprises one or more further circuits including, but not limited to, cellular transceiver, global positioning system (GPS) receiver, network interface circuitry for one or more of Wi-Fi, USB, Bluetooth, or the like. Examples of the processors 232 include, but are not limited to, a central processing unit (CPU), a multi-core CPU, a neural processing unit (NPU), a graphics processing unit (GPU), a digital signal processor (DSP), a field-programmable gate array (FPGA), an application-specific integrated circuit (ASIC), other programmable logic devices, a multimedia processor, an image signal processors (ISP), or the like. Examples of the memory devices 234 include one or more memory devices and/or memory macros described herein. In at least one embodiment, each of the processors 232 is coupled to a corresponding memory device among the memory devices 234.

Because the one or more of the memory devices 234 are CIM memory devices, various computations are performed in the memory devices which reduces the computing workload of the corresponding processor, reduces memory access time, and improves performance. In at least one embodiment, the IC device 200C is a system-on-a-chip (SOC). In at least one embodiment, one or more advantages described herein are achievable by the IC device 200C.

Figure 3:
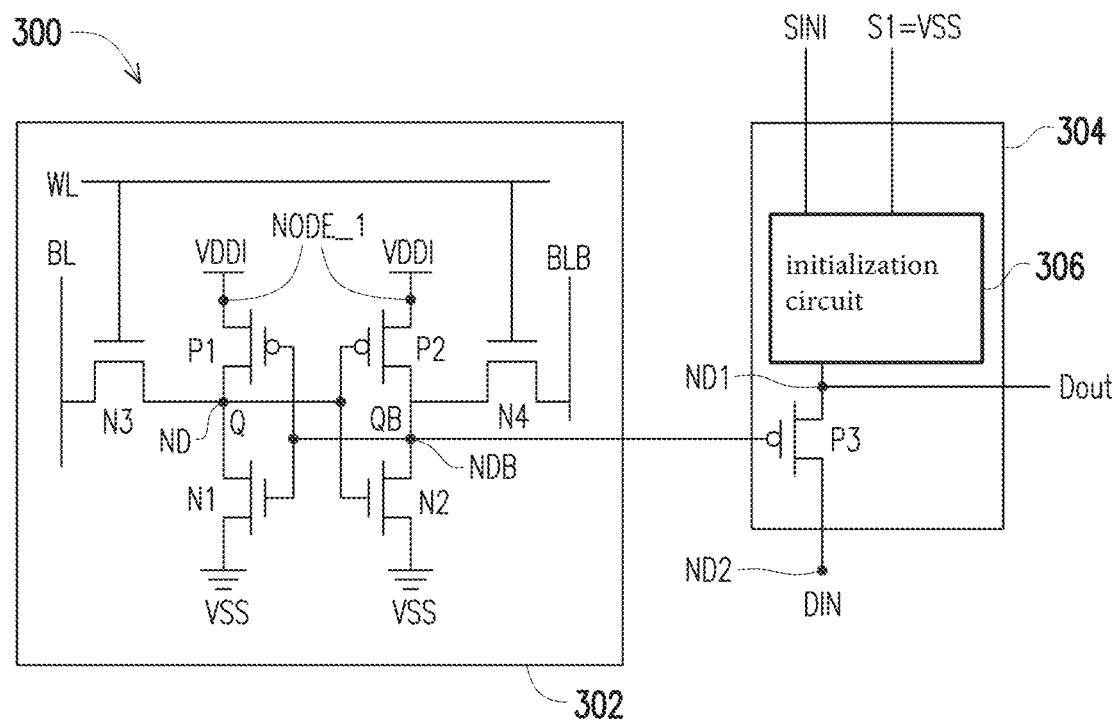
FIG. 3 is a circuit diagram of a memory cell, in accordance with some embodiments.

FIG. 3 is a circuit diagram of a memory cell 300, in accordance with some embodiments.

Memory cell 300 is an embodiment of one or more memory cells MC in memory array 112 of memory macro 110 of FIG. 1 expressed in a schematic diagram, and similar detailed description is therefore omitted.

Components that are the same or similar to those in one or more of FIGS. 1, 2A-2C, 3, 4, 5A-5E and 6 (shown below) are given the same reference numbers, and detailed description thereof is thus omitted. For ease of illustration, some of the labeled elements of FIGS. 1, 2A-2C, 3, 4, 5A-5E and 6 are not labelled in each of FIGS. 1, 2A-2C, 3, 4, 5A-5E and 6. In some embodiments, FIGS. 1, 2A-2C, 3, 4, 5A-5E and 6 include additional elements not shown in FIGS. 1, 2A-2C, 3, 4, 5A-5E and 6.

Memory cell 300 is usable as one or more memory cells MC in memory array 112 of memory macro 110 of FIG. 1, and similar detailed description is therefore omitted.

Memory cell 300 is usable as one or more memory cells in memory macro 202, 204, 206, 208 of FIG. 2A, or one or more memory cells in memory device 234 in FIG. 2C, and similar detailed description is therefore omitted.

Memory cell 300 includes a memory circuit 302 and a multiplier circuit 304.

Memory circuit 302 is useable as one or more storage portions 117a of one or more memory cells MC of FIG. 1, and multiplier circuit 304 is useable as one or more computation portions 117b of one or more memory cells MC of FIG. 1, and similar detailed description is therefore omitted.

Memory circuit 302 is coupled to the multiplier circuit 304. Memory circuit 302 is configured to store a logic value ("1" or "0") of a signal Q at a storage node ND. In some embodiments, signal Q corresponds to one or more pieces of weight data of FIG. 1, and an output signal Dout corresponds to one or more pieces of output data DO of FIG. 1, and similar detailed description is therefore omitted.

In some embodiments, memory circuit 302 is also referred to as a memory cell or a memory cell storage portion configured to store a logical value ("1" or "0") of a signal Q at a storage node ND, and a logical value ("0" or "1") of a signal QB at a storage node NDB. In some embodiments, memory circuit 302 is configured to store one or more weight values or weight data W from FIG. 2B.

Memory circuit 302 is a six transistor (6T) single port (SP) SRAM memory cell used for illustration. In some embodiments, memory circuit 302 employs a number of transistors other than six. In some embodiments, memory circuit 302 employs a number of ports other than one. Other types of memory for memory circuit 302 are within the scope of various embodiments.

Memory circuit 302 comprises two P-type metal oxide semiconductor (PMOS) transistors P1 and P2, and four N-type metal oxide semiconductor (NMOS) transistors N1, N2, N3, and N4. Transistors P1, P2, N1, and N2 form a cross latch or a pair of cross-coupled inverters. For example, PMOS transistor P1 and NMOS transistor N1 form a first inverter while PMOS transistor P2 and NMOS transistor N2 form a second inverter.

A source terminal of each of PMOS transistors P1 and P2 are configured as a voltage supply node NODE_1. Each voltage supply node NODE_1 is coupled to a first voltage source VDDI. Each of a drain terminal of PMOS transistor P1, a drain terminal of NMOS transistor N1, a gate terminal of PMOS transistor P2, a gate terminal of NMOS transistor N2, and a source terminal of NMOS transistor N3 are coupled together at storage node ND. At least the drain terminal of PMOS transistor P1 and the drain terminal of NMOS transistor N1 are configured as storage node ND. Storage node ND has a signal Q.

Each of a drain terminal of PMOS transistor P2, a drain terminal of NMOS transistor N2, a gate terminal of PMOS transistor P1, a gate terminal of NMOS transistor N1, a source terminal of NMOS transistor N4, and a gate terminal of a PMOS transistor P3 are coupled together at storage node NDB. At least the drain terminal of PMOS transistor P2 and the drain terminal of NMOS transistor N2 are configured as storage node NDB. Storage node NDB has a signal QB.

A source terminal of each of NMOS transistors N1 and N2 is configured as a supply reference voltage node (not labelled), and is coupled to a reference voltage supply VSSI. The reference voltage supply VSSI has a reference voltage VSS. In some embodiments, the source terminal of each of NMOS transistors N1 and N2 are coupled together.

A word line WL is coupled with a gate terminal of each of NMOS transistors N3 and N4. Word line WL is also called a write control line because NMOS transistors N3 and N4 are configured to be controlled by a signal on word line WL in order to transfer data between bit lines BL, BLB and corresponding nodes ND, NDB.

A drain terminal of NMOS transistor N3 is coupled to a bit line BL. A drain terminal of NMOS transistor N4 is coupled to a bit line BLB. Bit lines BL and BLB are configured as both data input and output for memory circuit 302. In some embodiments, in a write operation, applying a logical value to a first bit line BL and the opposite logical value to the other bit line BLB enables writing the logical values on the bit lines to memory circuit 302. Each of bit lines BL and BLB is called a data line because the data carried on bit lines BL and BLB are written to and read from corresponding nodes ND and NDB.

Word line WL corresponds to one or more word lines WL1, WL2, . . . , WLr in FIG. 1, bit line BL corresponds to one or more bit lines BL1, BL2, . . . , BLt in FIG. 1, and bit line bar BLB corresponds to one or more bit line bars BLB1, BLB2, . . . , BLBt in FIG. 1, and similar detailed description is therefore omitted.

Multiplier circuit 304 is coupled to the memory circuit 302. Multiplier circuit 304 is configured to generate output signal Dout in response to input signal DIN and at least signal QB or signal Q. In some embodiments, input signal DIN corresponds to one or more pieces of input data D_IN of FIG. 1, and similar detailed description is therefore omitted.

Multiplier circuit 304 is configured to perform a CIM operation of signal Q and input signal DIN, thereby generating the output signal Dout. Stated differently, the output signal Dout corresponds to the CIM operation of signal Q and input signal DIN. In some embodiments, the CIM operation is an AND operation, and the output signal Dout corresponds to an AND operation between signal Q and input signal DIN. In some embodiments, the output signal Dout corresponds to a product of signal Q and input signal DIN. Other operation types for the CIM operation are within the scope of the present disclosure.

Multiplier circuit 304 includes a PMOS transistor P3, an initialization circuit 306 and an output node ND1. A voltage of the output node ND1 corresponds to the output signal Dout.

In some embodiments, multiplier circuit 304 has an initialization mode and a sensing mode. Each initialization mode is associated with a corresponding sensing mode and vice versa.

During the initialization mode, the initialization circuit 306 is configured to initialize the multiplier circuit 304 in response to an initialization signal SINI and a signal S1.

During the sensing mode, multiplier circuit 304 is configured to set the output signal Dout in response to input signal DIN and at least signal QB or signal Q. In some embodiments, the sensing mode is associated with a read operation of memory circuit 302, and the data stored (e.g, signal Q or QB) within the memory circuit 302 is read by the multiplier circuit 304 in generating the output signal Dout. In some embodiments, during the sensing mode, the initialization circuit 306 is disabled or turned off by initialization signal SINI.

In some embodiments, during the sensing mode, multiplier circuit 304 is configured to set a voltage of the output node ND1 of multiplier circuit 304 in response to input signal DIN and at least signal QB or signal Q, thereby setting a voltage of the output signal Dout.

PMOS transistor P3 is coupled to an output node ND1, the initialization circuit 306 and the memory circuit 302. PMOS transistor P3 is configured to receive input signal DIN and at least signal QB or signal Q. In some embodiments, during the sensing mode, PMOS transistor P3 is configured to set the voltage of the output node ND1 of multiplier circuit 304 in response to input signal DIN and at least signal QB or signal Q.

A drain terminal of PMOS transistor P3 is coupled to a node ND2, and is configured to receive input signal DIN. A source of PMOS transistor P3 is coupled to the initialization circuit 306 and the output node ND1.

A gate terminal of PMOS transistor P3 is coupled to each of storage node NDB, the drain terminal of PMOS transistor P2, the drain terminal of NMOS transistor N2, the gate terminal of PMOS transistor P1, the gate terminal of NMOS transistor N1, and the source terminal of NMOS transistor N4. The gate terminal of PMOS transistor P3 is an input node of multiplier circuit 304, and is configured to receive signal QB. PMOS transistor P3 is turned on or off in response to the signal QB.

In some embodiments, during the sensing mode, the PMOS transistor P3 is turned on in response to the signal QB being a logical low value ("0"), thereby electrically coupling node ND2 and node ND1, and setting the voltage of node ND1 to be equal to input signal DIN.

In some embodiments, during the sensing mode, the PMOS transistor P3 is turned off in response to the signal QB being a logical high value ("1"), thereby electrically decoupling node ND2 and node ND1, and the voltage of node ND1 is set based on an initialization value set by the initialization circuit 306 during the initialization phase. Stated differently, during the sensing mode, when the PMOS transistor P3 is turned off, the voltage of node ND1 is maintained at the initialization value set by the initialization circuit 306 during the initialization phase.

Initialization circuit 306 is coupled to PMOS transistor P3 by the output node ND1. During the initialization mode, initialization circuit 306 is enabled or turned on, and is configured to set output signal Dout to an initialization value in response to initialization signal SINI and signal S1. In some embodiments, initializing the multiplier circuit 304 corresponds to resetting the multiplier circuit 304 to the initialization value. In some embodiments, the initialization signal SINI corresponds to an enable signal that enables or disables the initialization circuit 306.

In some embodiments, the initialization value is a logical low value ("0"). In some embodiments, the initialization value is a logical high value ("1"). In some embodiments, the signal S1 is equal to a reference voltage VSS. In some embodiments, the signal S1 is equal to a supply voltage VDD.

In some embodiments, memory cell 300 achieves benefits similar to the benefits discussed above with respect to at least FIG. 1 and FIGS. 2A-2C.

Other transistor terminals for each of NMOS transistors N1, N2, N3 or N4 or each of PMOS transistors P1, P2 or P3 of the present application are within the scope of the present disclosure. For example, reference to the drains and sources of a same transistor in the present disclosure can be changed to a source and a drain of the same transistor.

Other configurations, quantities of transistors or transistor types of memory cell 300 are within the scope of the present disclosure.

Figures 4, 5A:
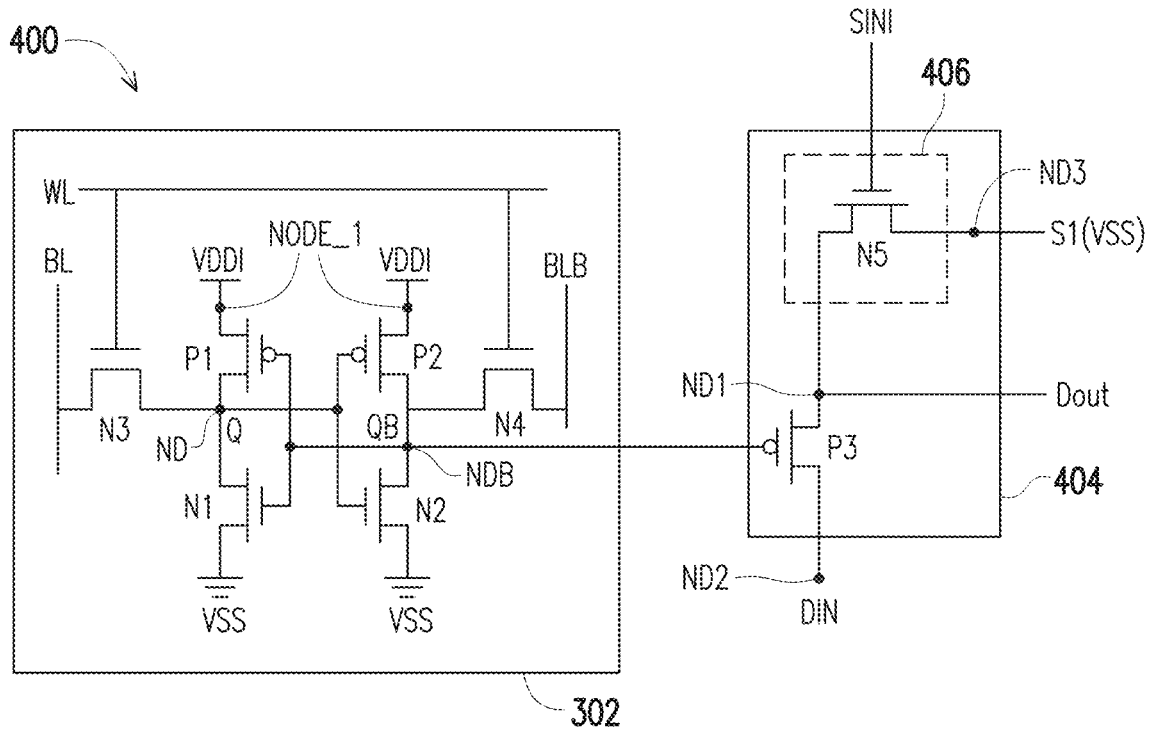
FIG. 4 is a circuit diagram of a memory cell, in accordance with some embodiments.
FIG. 5A is a truth table of a memory cell array shown in FIG. 5C, in accordance with some embodiments.

FIG. 4 is a circuit diagram of a memory cell 400, in accordance with some embodiments.

Memory cell 400 is an embodiment of one or more memory cells MC in memory array 112 of memory macro 110 of FIG. 1 expressed in a schematic diagram, and similar detailed description is therefore omitted.

Memory cell 400 is an embodiment of memory cell 300 of FIG. 3, and similar detailed description is therefore omitted.

Memory cell 400 includes memory circuit 302 and a multiplier circuit 404. Multiplier circuit 404 is an embodiment of multiplier circuit 304 of FIG. 3, and similar detailed description is therefore omitted.

Multiplier circuit 404 includes PMOS transistor P3, an initialization circuit 406 and output node ND1. Initialization circuit 406 is an embodiment of initialization circuit 306 of FIG. 3, and similar detailed description is therefore omitted.

Initialization circuit 406 includes an NMOS transistor N5.

A source terminal of NMOS transistor N5 is coupled to a node ND3 and the reference voltage supply VSSI. The source terminal of NMOS transistor N5 is configured to receive the reference voltage VSS (e.g, signal S1).

A drain terminal of NMOS transistor N5 is coupled to the drain terminal of PMOS transistor P3 and the output node ND1.

A gate terminal of NMOS transistor N5 is an input node of initialization circuit 406, and is configured to receive the initialization signal SINI. NMOS transistor N5 is turned on or off in response to the initialization signal SINI. A gate terminal of NMOS transistor N5 is coupled to a source of the initialization signal SINI.

During the initialization mode, NMOS transistor N5 is enabled or turned on, and is configured to set output signal Dout to an initialization value in response to initialization signal SINI. In some embodiments, initializing the multiplier circuit 404 corresponds to resetting the multiplier circuit 404 to the initialization value.

In some embodiments, during the initialization mode, the NMOS transistor N5 is turned on in response to the initialization signal SINI being a logical high value ("1"), thereby electrically coupling node ND3 and node ND1, and setting the voltage of node ND1 to be equal to the signal S1 (e.g., reference voltage VSS).

In some embodiments, during the initialization mode, the input signal DIN is set to a logical low value ("0") to avoid node ND2 having a logical value different from the signal S1 (e.g., reference voltage VSS) thereby preventing a conflict between logical values between nodes ND3 and ND2.

In some embodiments, before or after the initialization mode (e.g., the sensing mode), the NMOS transistor N5 is turned off in response to the initialization signal SINI being a logical low value ("0"), thereby electrically decoupling node ND3 and node ND1 from each other. In some embodiments, before or after the initialization mode, the voltage of node ND1 can be set by PMOS transistor P3 in response to the value of the input signal DIN. In some embodiments, before or after the initialization mode, if the PMOS transistor P3 is turned on, the voltage of node ND1 can be set by PMOS transistor P3 in response to the value of the input signal DIN. In some embodiments, before or after the initialization mode, if the PMOS transistor P3 is turned off, the voltage of node ND1 is equal to the initialization value set by NMOS transistor N5 during the initialization phase.

In some embodiments, memory cell 400 achieves benefits similar to the benefits discussed above with respect to at least FIG. 1, FIGS. 2A-2C, FIG. 3 and FIG. 4.

Other transistor terminals for NMOS transistor N5 of the present application are within the scope of the present disclosure. For example, reference to the drains and sources of a same transistor in the present disclosure can be changed to a source and a drain of the same transistor.

Other configurations, quantities of transistors or transistor types of memory cell 400 are within the scope of the present disclosure.

Figure 5B:
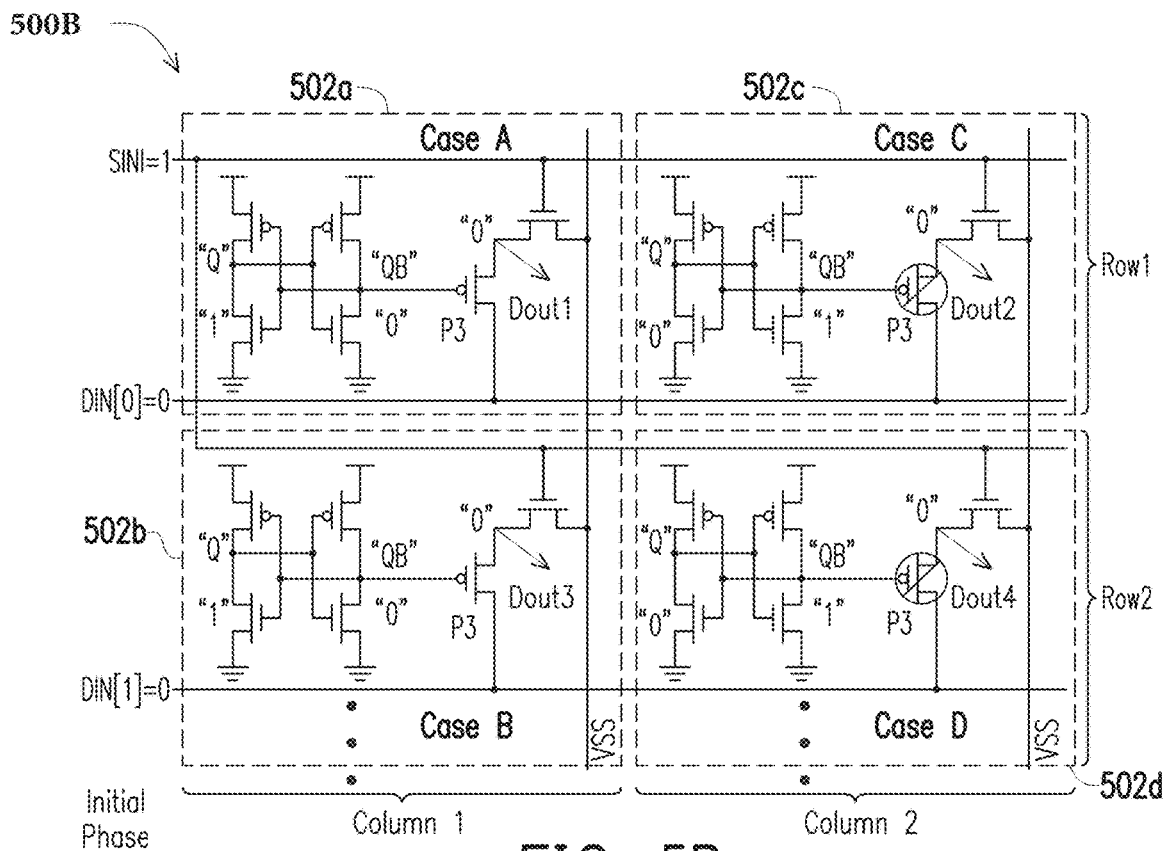
FIGS. 5B-5C are corresponding diagrams of a memory cell array, in accordance with some embodiments.
Figure 5C:
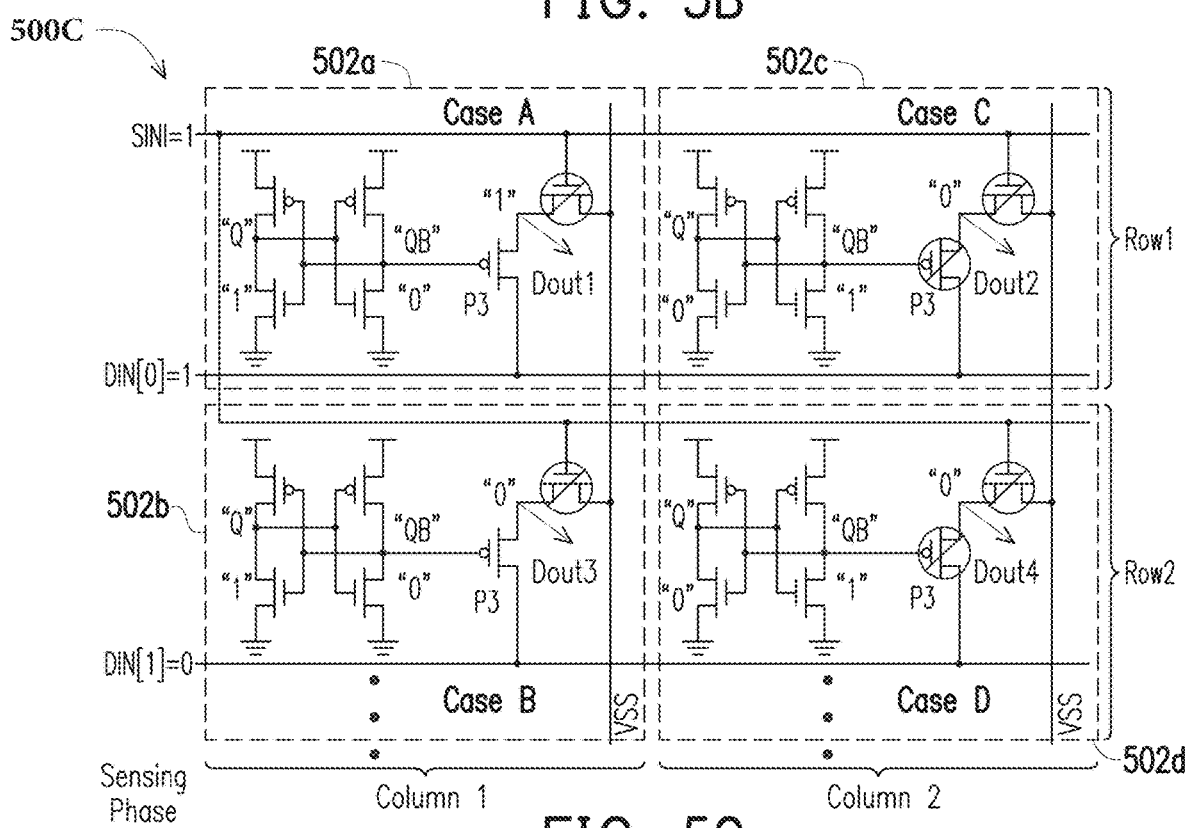

FIG. 5A is a truth table 500A of a memory cell array 501 shown in FIG. 5C, in accordance with some embodiments. The values and format of table 500A are provided as an example, and other values and/or formats for truth table 500A are within the scope of the present disclosure.

In some embodiments, truth table 500A corresponds to the memory cell array 501 of diagram 500C of FIG. 5C in the sensing mode. In some embodiments, truth table 500A is a truth table of at least memory cell 300 of FIG. 3, memory cell 400 of FIG. 4 or memory cell 600 of FIG. 6 in the sensing mode.

In some embodiments, truth table 500A corresponds to a truth table of an AND gate where the input terminals of the AND gate are configured to receive input signal DIN and signal Q, and the output terminals of the AND gate are configured to output signal Dout. Stated differently, the output signal Dout corresponds to an AND operation between input signal DIN and signal Q.

The values of the truth table 500A are described below in FIGS. 5C-5E with respect to diagram 500C.

As shown in row 1 and column 2 of truth table 500A of FIG. 5A, if input signal DIN is a logical 1 and signal Q is a logical 1, then output signal Dout is a logical 1 (e.g., shown also as "Case A").

As shown in row 2 and column 2 of truth table 500A of FIG. 5A, if input signal DIN is a logical 0 and signal Q is a logical 1, then output signal Dout is a logical 0 (e.g., shown also as "Case B").

As shown in row 1 and column 3 of truth table 500A of FIG. 5A, if input signal DIN is a logical 1 and signal Q is a logical 0, then output signal Dout is a logical 0 (e.g., shown also as "Case C").

As shown in row 2 and column 3 of truth table 500A of FIG. 5A, if input signal DIN is a logical 0 and signal Q is a logical 0, then output signal Dout is a logical 0 (e.g., shown also as "Case D").

Other values and arrangements for truth table 500A are within the scope of the present disclosure.

FIGS. 5B-5C are corresponding diagrams 500B-500C of a memory cell array 501, in accordance with some embodiments.

Diagram 500B of FIG. 5B is an example of the initialization mode of memory cell array 501, in accordance with some embodiments. Diagram 500C of FIG. 5C is an example of the sensing mode of memory cell array 501, in accordance with some embodiments.

Memory cell array 501 is embodiments of two rows and two columns of memory cells in memory array 112 of memory macro 110 of FIG. 1 expressed in a schematic diagram, and similar detailed description is therefore omitted.

Memory cell array 501 include memory cells 502a, 502b, 502c and 502d.

Each memory cell 502a, 502b, 502c and 502d corresponds to memory cell 400 of FIG. 4, and similar detailed description is therefore omitted. For ease of illustration, pass-gate transistors (e.g., NMOS transistors N3 and N4) of memory cell 400 are not shown in FIGS. 5B-5C.

Memory cell 502a is in row 1 and column 1 of memory cell array 501, memory cell 502b is in row 2 and column 1 of memory cell array 501, memory cell 502c is in row 1 and column 2 of memory cell array 501, and memory cell 502d is in row 2 and column 2 of memory cell array 501.

Each memory cell 502a, 502b, 502c and 502d is associated with a corresponding case A, B, C and D of the truth table 500A in FIG. 5A, and similar detailed description is therefore omitted.

Memory cells 502a and 502c are configured to receive input signal DIN[0], and memory cells 502b and 502d are configured to receive input signal DIN[1]. Memory cells 502a, 502b, 502c and 502d are configured to receive signal SINI. Memory cells 502a, 502b, 502c and 502d are configured to output a corresponding output signal Dout1, Dout2, Dout3 and Dout4. Memory cells 502a, 502b, 502c and 502d are configured to store corresponding signalS Q1, Q2, Q3 and Q4.

In some embodiments, diagram 500B is an example of the initialization mode of memory cell array 501, and therefore the initialization signal SINI in FIG. 5B is equal to a logical 1. In some embodiments, during the initialization mode, the input signals DIN[0] and DIN[1] are set to a non-initialization value (e.g., a logical low value ("0")) to avoid node ND2 having a logical value different from the signal S1 (e.g., reference voltage VSS) thereby preventing a conflict between logical values between nodes ND3 and ND2. In some embodiments, the input signals DIN[0] and DIN[1] are set to the non-initialization value by memory controller 120.

In some embodiments, diagram 500C is an example of the sensing mode of memory cell array 501, and therefore the initialization signal SINI in FIG. 5C is equal to a logical 0.

Figure 5D:
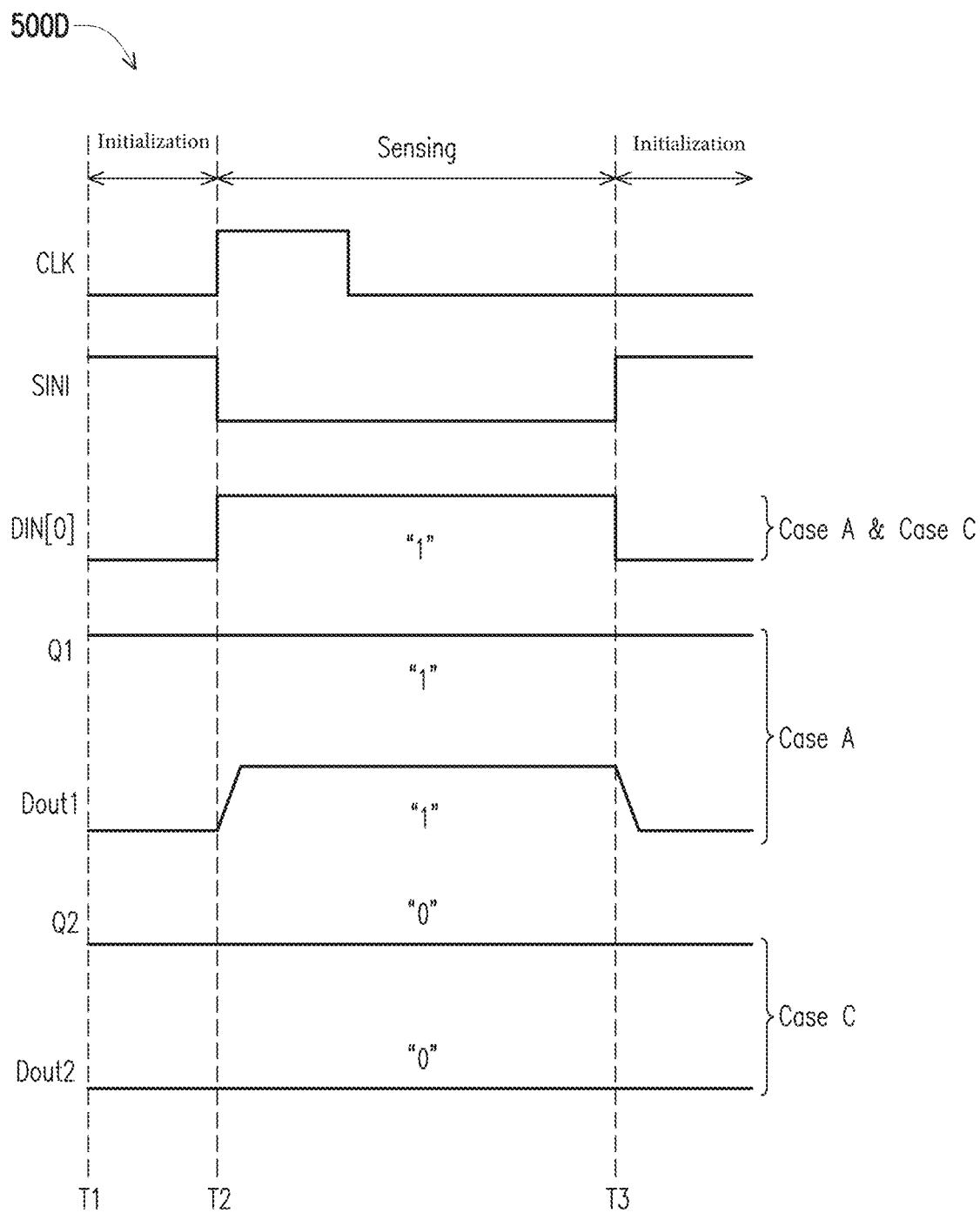
FIGS. 5D-5E are graphs of corresponding waveforms of the memory cell array of FIGS. 5B-5C, in accordance with some embodiments.
Figure 5E:
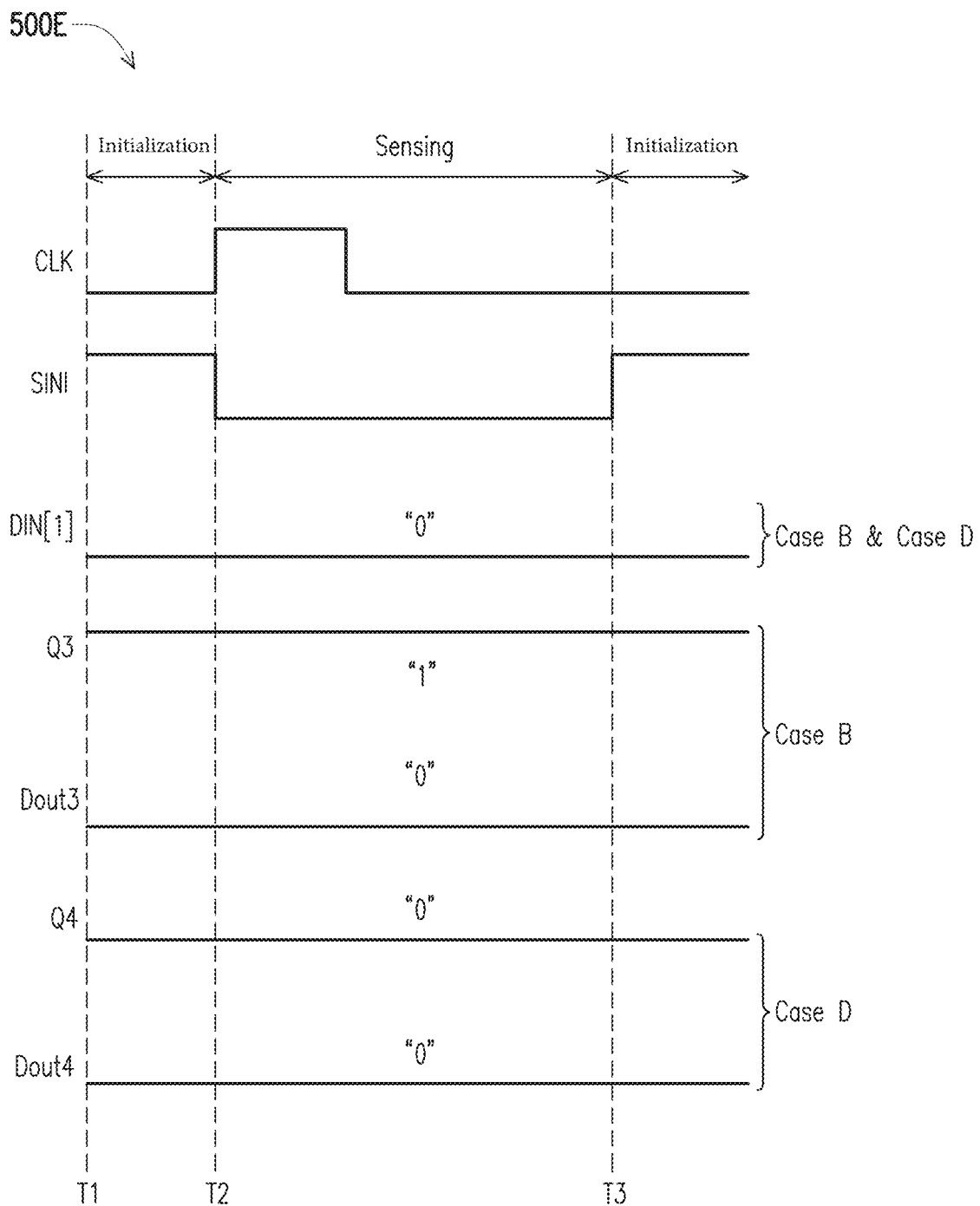

Further operations of memory cell array 501 of diagrams 500B and 500C are described in timing diagram 500D of FIG. 5D, and timing diagram 500E of FIG. 5E.

FIGS. 5D-5E are graphs of corresponding waveforms 500D-500E of memory cell array 501 of FIGS. 5B-5C, in accordance with some embodiments.

In some embodiments, waveform 500D is an example of the initialization mode and the sensing mode of memory cells 502a and 502c of corresponding Cases A and C.

In some embodiments, waveform 500E is an example of the initialization mode and the sensing mode of memory cells 502b and 502d of corresponding Cases B and D.

The initialization mode is from time T1 to time T2, and the sensing mode is from time T2 to time T3. In some embodiments, the initialization mode and the sensing mode alternate with each other.

At time T1, the initialization signal SINI is equal to logical 1, and each of input signal DIN[0] and input signal DIN[1] are equal to logical 0. In response to the initialization signal SINI being equal to logical 1, each NMOS transistor N5 in the corresponding memory cell 502a, 502b, 502c and 502d is turned on, thereby setting the voltage of the output signal Dout1, Dout2, Dout3 and Dout4 to be equal to a logical 0 (e.g., reference voltage VSS).

At time T2, the initialization signal SINI transitions to be equal to logical 0, and input signal DIN[0] transitions to be equal to logical 1.

At time T2, input signal DIN[1] is equal to logical 0, signal Q1 is equal to logical 1, signal Q2 is equal to logical 0, signal Q3 is equal to logical 1, and signal Q4 is equal to logical 0.

In response to the initialization signal SINI being equal to logical 0, each NMOS transistor N5 in the corresponding memory cell 502a, 502b, 502c and 502d is turned off, thereby decoupling the node ND3 in the corresponding memory cell 502a, 502b, 502c and 502d from node ND1 in the corresponding memory cell 502a, 502b, 502c and 502d.

As shown in case A, in response to signal Q1 being equal to logical 1, signal QB1 is equal to logical 0, thereby causing the PMOS transistor P3 in memory cell 502a to be turned on, thereby coupling the node ND2 in the memory cell 502a with node ND1 in the corresponding memory cell 502a, and thereby setting the output signal Dout1 to be equal to the input signal DIN[0]. In response to the input signal DIN[0] being equal to logical 1, causes the output signal Dout1 to be equal to logical 1.

As shown in case C, in response to signal Q2 being equal to logical 1, signal QB2 is equal to logical 0, thereby causing the PMOS transistor P3 in memory cell 502b to be turned on, thereby coupling the node ND2 in the memory cell 502b with node ND1 in the corresponding memory cell 502b, and thereby setting the output signal Dout2 to be equal to the input signal DIN[1]. In response to the input signal DIN[1] being equal to logical 0, causes the output signal Dout2 to be equal to logical 0.

As shown in case B, in response to signal Q3 being equal to logical 0, signal QB3 is equal to logical 1, thereby causing the PMOS transistor P3 in memory cell 502c to be turned off, thereby decoupling the node ND2 in the memory cell 502c with node ND1 in the corresponding memory cell 502c, and thereby the output signal Dout3 is equal to the initialization value (e.g., reference voltage VSS or logical 0).

As shown in case D, in response to signal Q4 being equal to logical 0, signal QB4 is equal to logical 1, thereby causing the PMOS transistor P3 in memory cell 502d to be turned off, thereby decoupling the node ND2 in the memory cell 502d with node ND1 in the corresponding memory cell 502d, and thereby the output signal Dout4 is equal to the initialization value (e.g., reference voltage VSS or logical 0).

At time T3, the initialization signal SINI transition to be equal to logical 1, and each of input signal DIN[0] and input signal DIN[1] are equal to logical 0. In response to the initialization signal SINI being equal to logical 1, each NMOS transistor N5 in the corresponding memory cell 502a, 502b, 502c and 502d is turned on, thereby setting the voltage of the output signal Dout1, Dout2, Dout3 and Dout4 to be equal to a logical 0 (e.g., reference voltage VSS).

While memory cell array 501 of FIGS. 5B-5C are described as memory cells in different rows and columns, in some embodiments, each of Case A, B, C, and D corresponds to a memory cell in a same column and same row with different input signal (e.g., input signal DIN and signal Q).

In some embodiments, memory cell array 501 achieves benefits similar to the benefits discussed above with respect to at least FIG. 1, FIGS. 2A-2C, FIG. 3, and FIG. 4.

Other configurations of memory cell array 501 are within the scope of the present disclosure.

Other configurations of waveforms 500D and 500E are within the scope of the present disclosure.

Figure 6:
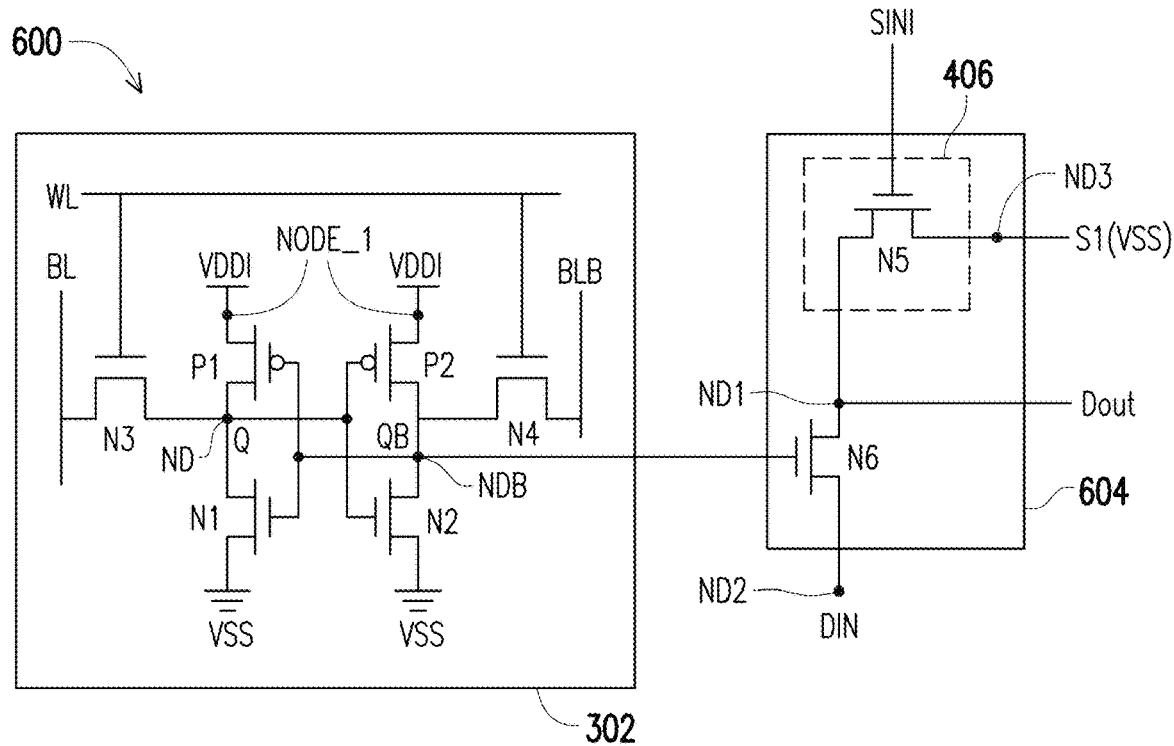
FIG. 6 is a circuit diagram of a memory cell, in accordance with some embodiments.

FIG. 6 is a circuit diagram of a memory cell 600, in accordance with some embodiments.

Memory cell 600 is an embodiment of one or more memory cells MC in memory array 112 of memory macro 110 of FIG. 1 expressed in a schematic diagram, and similar detailed description is therefore omitted.

Memory cell 600 is a variation of memory cell 400 of FIG. 4, and similar detailed description is therefore omitted. In comparison with memory cell 400 of FIG. 4, multiplier circuit 604 of FIG. 6 replaces multiplier circuit 404 of FIG. 4, and similar detailed description is therefore omitted.

Memory cell 600 includes memory circuit 302 and multiplier circuit 604.

In comparison with multiplier circuit 404 of FIG. 4, an NMOS transistor N6 of multiplier circuit 604 of FIG. 6 replaces the PMOS transistor P3 of multiplier circuit 404 of FIG. 4, and similar detailed description is therefore omitted.

Multiplier circuit 604 includes NMOS transistor N6, initialization circuit 406 and output node ND1.

Each of the drain terminal of PMOS transistor P1, the drain terminal of NMOS transistor N1, the gate terminal of PMOS transistor P2, the gate terminal of NMOS transistor N2, the source terminal of NMOS transistor N3 and a gate terminal of a NMOS transistor N6 are coupled together at storage node ND.

Each of the drain terminal of PMOS transistor P2, the drain terminal of NMOS transistor N2, the gate terminal of PMOS transistor P1, the gate terminal of NMOS transistor N1, and the source terminal of NMOS transistor N4 are coupled together at storage node NDB.

NMOS transistor N6 is coupled to output node ND1, the initialization circuit 406 and the memory circuit 302. NMOS transistor N6 is configured to receive input signal DIN and signal Q. In some embodiments, during the sensing mode, NMOS transistor N6 is configured to set the voltage of the output node ND1 of multiplier circuit 604 in response to input signal DIN and at least signal QB or signal Q.

A drain terminal of NMOS transistor N6 is coupled to the node ND2, and is configured to receive input signal DIN. A source of NMOS transistor N6 is coupled to the drain of NMOS transistor N5 of initialization circuit 406 and the output node ND1.

A gate terminal of NMOS transistor N6 is coupled to each of the drain terminal of PMOS transistor P1, the drain terminal of NMOS transistor N1, the gate terminal of PMOS transistor P2, the gate terminal of NMOS transistor N2 and the source terminal of NMOS transistor N3. The gate terminal of NMOS transistor N6 is an input node of multiplier circuit 604, and is configured to receive signal Q. NMOS transistor N6 is turned on or off in response to the signal Q.

In some embodiments, during the sensing mode, the NMOS transistor N6 is turned on in response to the signal Q being a logical high value ("1"), thereby electrically coupling node ND2 and node ND1, and setting the voltage of node ND1 to be equal to input signal DIN.

In some embodiments, during the sensing mode, the NMOS transistor N6 is turned off in response to the signal Q being a logical low value ("0"), thereby electrically decoupling node ND2 and node ND1, and the voltage of node ND1 is set based on the initialization value set by the initialization circuit 406 during the initialization phase. Stated differently, during the sensing mode, when the NMOS transistor N6 is turned off, the voltage of node ND1 is maintained at the initialization value set by the initialization circuit 406 during the initialization phase.

In some embodiments, memory cell 600 achieves benefits similar to the benefits discussed above with respect to at least FIG. 1, FIGS. 2A-2C, FIG. 3, FIG. 4 and FIGS. 5A-5E.

Other transistor terminals for NMOS transistor N6 of the present application are within the scope of the present disclosure. For example, reference to the drains and sources of a same transistor in the present disclosure can be changed to a source and a drain of the same transistor.

Other configurations, quantities of transistors or transistor types of memory cell 600 are within the scope of the present disclosure.

Figure 7A:
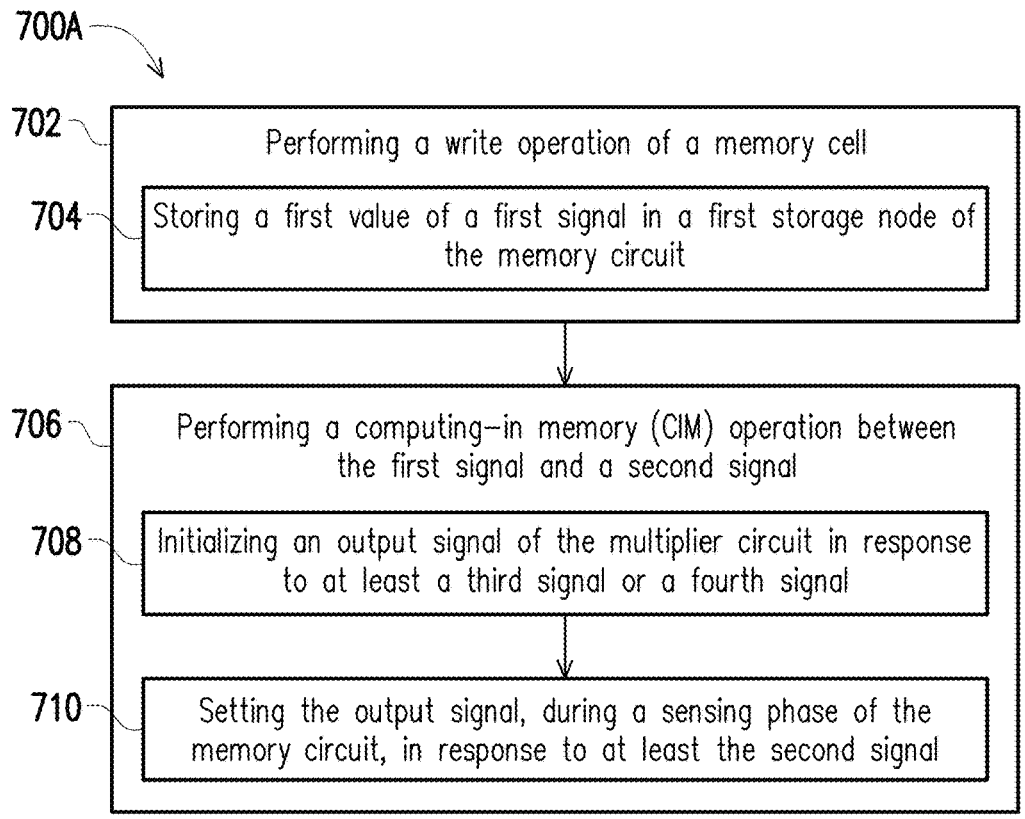
FIG. 7A is a flowchart of a method of operating a circuit, in accordance with some embodiments.

FIG. 7A is a flowchart of a method 700A of operating a circuit, in accordance with some embodiments. In some embodiments, FIG. 7A is a flowchart of method 700A of operating a memory circuit, such as memory device 100 of FIG. 1, memory device 200A of FIG. 2A, neural network 200B of FIG. 2B, IC device 200C of FIG. 2C, memory cell 300 of FIG. 3, memory cell 400 of FIG. 4, diagrams 500B-500C of memory cell array 501 of FIGS. 5B-5C, memory cell 600 of FIG. 6.

Figure 7B:
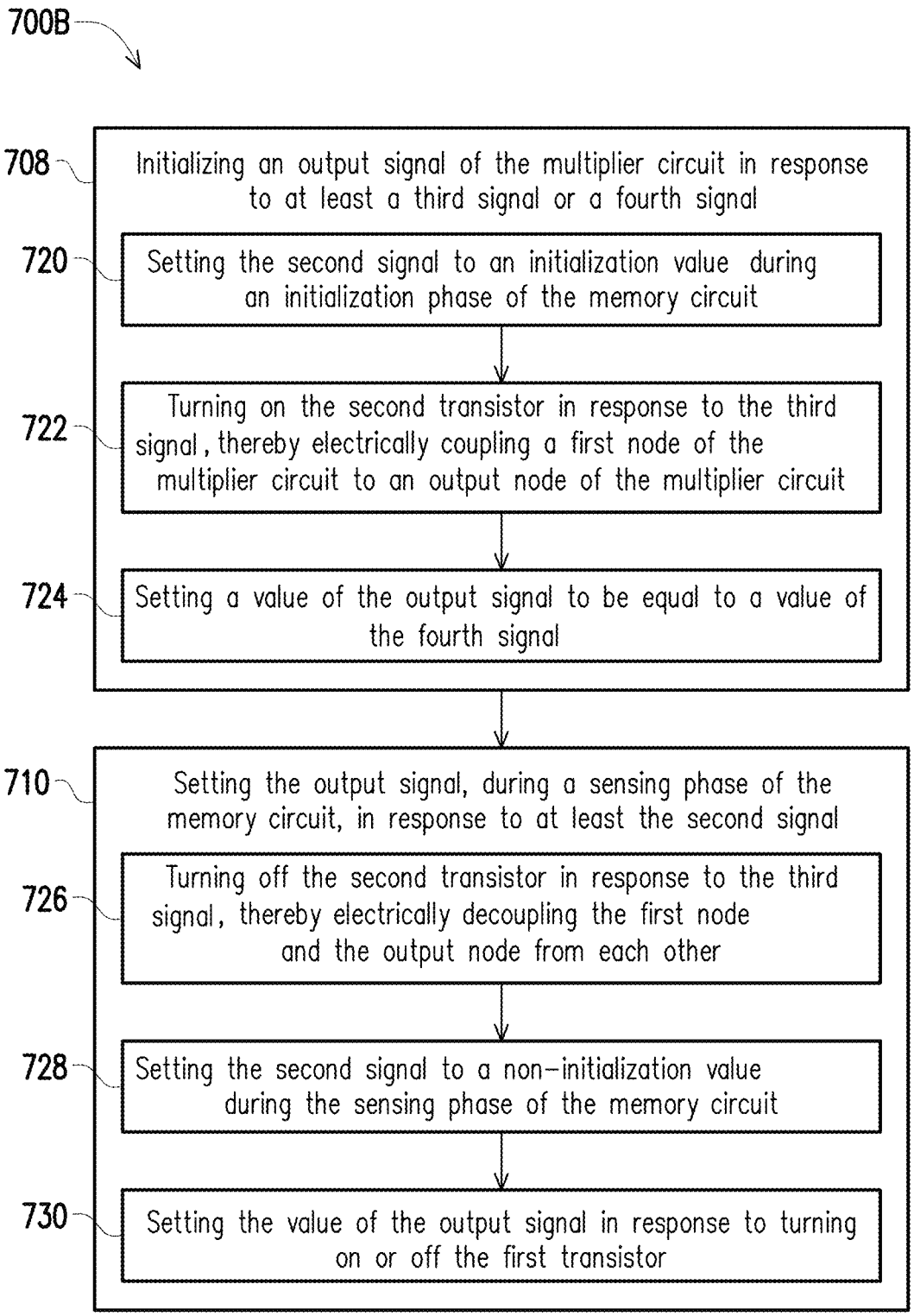
FIG. 7B is a flowchart of a method of operating a circuit, in accordance with some embodiments.

It is understood that additional operations may be performed before, during, and/or after the methods 700A-700B depicted in FIGS. 7A-7B, and that some other processes may only be briefly described herein. In some embodiments, other order of operations of methods 700A-700B is within the scope of the present disclosure. Methods 700A-700B include exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of methods 700A-700B is not performed.

In operation 702 of method 700A, a write operation of a memory cell is performed. In some embodiments, operation 702 is performed by memory controller 120.

In some embodiments, the memory cell of method 700A includes one or more memory cells of memory array 112, at least memory macro 202, 204, 206 or 208, memory devices 234, memory cell 117 or memory cell 300, 400 or 600.

In some embodiments, the memory cell of methods 700A-700B includes a memory circuit and a multiplier circuit. In some embodiments, the memory circuit of methods 700A-700B includes at least storage portions 117a or memory circuit 302. In some embodiments, the multiplier circuit of methods 700A-700B includes at least computation portion 117b, multiplier circuit 304, multiplier circuit 404 or multiplier circuit 604.

In some embodiments, operation 702 includes operation 704.

In operation 704 of method 700A, a first value of a first signal is stored in a first storage node of the memory circuit.

In some embodiments, the first signal of methods 700A-700B includes at least signal Q or QB or weight data W. In some embodiments, the first signal corresponds to a first weight. In some embodiments, the first weight of methods 700A-700B includes at least one or more pieces of weight data W. In some embodiments, the first value of the first signal of methods 700A-700B includes at least a logical 0 or logical 1.

In operation 706 of method 700A, a CIM operation is performed between the first signal and a second signal, thereby generating an output signal. In some embodiments, operation 706 includes performing a read operation of the memory cell.

In some embodiments, the output signal of methods 700A-700B includes at least output signal Dout or output signal DO. In some embodiments, the CIM operation of methods 700A-700B includes at least the AND operation of truth table 500A. In some embodiments, the second signal of methods 700A-700B includes at least input signal DIN or input data D_IN.

In some embodiments, operation 706 is performed by the multiplier circuit. In some embodiments, the multiplier circuit includes a first transistor and an initialization circuit.

In some embodiments, the first transistor of methods 700A-700B includes at least PMOS transistor P3. In some embodiments, the first transistor of methods 700A-700B includes at least NMOS transistor N6.

In some embodiments, the initialization circuit of methods 700A-700B includes at least initialization circuit 306 or 406. In some embodiments, the initialization circuit of methods 700A-700B includes at least NMOS transistor N5.

In some embodiments, operation 706 includes at least operation 708 or 710.

In operation 708 of method 700A, the output signal of the multiplier circuit is initialized in response to at least a third signal or a fourth signal. In some embodiments, operation 706 is performed by the initialization circuit.

In some embodiments, the third signal of methods 700A-700B includes at least initialization signal SINI. In some embodiments, the fourth signal of methods 700A-700B includes at least reference voltage VSS.

In operation 710 of method 700A, the output signal is set, during a sensing phase of the memory circuit, in response to at least the second signal. In some embodiments, operation 706 is performed by the first transistor.

In some embodiments, after operation 710, method 700A is repeated.

FIG. 7B is a flowchart of a method 700B of operating a circuit, in accordance with some embodiments. In some embodiments, FIG. 7B is a flowchart of method 700B of operating a memory circuit, such as memory device 100 of FIG. 1, memory device 200A of FIG. 2A, neural network 200B of FIG. 2B, IC device 200C of FIG. 2C, memory cell 300 of FIG. 3, memory cell 400 of FIG. 4, diagrams 500B-500C of memory cell array 501 of FIGS. 5B-5C, memory cell 600 of FIG. 6.

In some embodiments, method 700B is an embodiment of operation 706, and similar detailed description is therefore omitted.

Method 700B includes at least operation 708 or 710 (described above).

In operation 704 of method 700B, the first value of the first signal is stored in the first storage node of the memory circuit. Operation 708 of method 700B includes at least operation 720, 722 or 724.

In operation 720 of method 700A, the second signal is set to an initialization value during an initialization phase of the memory circuit. In some embodiments, operation 720 is performed by the initialization circuit or a second transistor.

In some embodiments, the initialization circuit of methods 700A-700B includes the second transistor. In some embodiments, the second transistor of methods 700A-700B includes at least NMOS transistor N5. In some embodiments, the initialization value of methods 700A-700B is a logical 0. In some embodiments, the initialization value of methods 700A-700B is a logical 1.

In operation 722 of method 700A, the second transistor is turned on in response to the third signal, thereby electrically coupling a first node of the multiplier circuit to an output node of the multiplier circuit. In some embodiments, operation 722 is performed in response to the third signal being a logical 1.

In some embodiments, the first node of methods 700A-700B includes at least node ND3. In some embodiments, the output node of methods 700A-700B includes at least node ND1.

In operation 724 of method 700A, a value of the output signal is set to be equal to a value of the fourth signal. In some embodiments, the value of the output signal is set to be equal to the value of the reference voltage VSS or a logical 0.

In operation 710 of method 700B, the output signal is set, during the sensing phase of the memory circuit, in response to at least the second signal. Operation 710 of method 700B includes at least operation 726, 728 or 730.

In operation 726 of method 700B, the second transistor is turned off in response to the third signal, thereby electrically decoupling the first node and the output node from each other. In some embodiments, operation 726 is performed in response to the third signal being a logical 0.

In operation 728 of method 700B, the second signal is set to a non-initialization value during the sensing phase of the memory circuit. In some embodiments, the non-initialization value includes a logical 0 or logical 1. In some embodiments, the non-initialization value is a data value of input signal DIN during the sensing phase of the memory circuit.

In some embodiments, the second signal is set to the non-initialization value by the memory controller 120.

In operation 730 of method 700B, the value of the output signal is set in response to turning on or off the first transistor.

In some embodiments, operation 730 of method 700B includes at least turning on the first transistor in response to the first signal or an inverted first signal QB, thereby electrically coupling a second node of the multiplier circuit to the output node of the multiplier circuit, and setting the value of the output signal to be equal to a value of the second signal.

In some embodiments, the second node of methods 700A-700B includes at least node ND2.

In some embodiments, operation 730 of method 700B includes at least turning off the first transistor in response to the first signal or the inverted first signal, thereby electrically decoupling the second node and the output node from each other, and maintaining the value of the output signal to be equal to the value of the fourth signal.

By operating methods 700A-700B, the memory circuit operates to achieve the benefits discussed above with respect to at least FIG. 1, FIGS. 2A-2C, FIG. 3, FIG. 4, FIGS. 5A-5E and FIG. 6.

While methods 700A-700B were described above with reference to a single memory cell of memory array 112, it is understood that methods 700A-700B apply to each row and each column of memory device 100, in some embodiments.

Furthermore, various PMOS or NMOS transistors shown in FIGS. 3-4, 5B-5C and 6 are of a particular dopant type (e.g., N-type or P-type) are for illustration purposes. Embodiments of the disclosure are not limited to a particular transistor type, and one or more of the PMOS or NMOS transistors shown in FIGS. 3-4, 5B-5C and 6 can be substituted with a corresponding transistor of a different transistor/dopant type. Similarly, the low or high logical value of various signals used in the above description is also for illustration. Embodiments of the disclosure are not limited to a particular logical value when a signal is activated and/or deactivated. Selecting different logical values is within the scope of various embodiments. Selecting different numbers of transistors in FIGS. 3-4, 5B-5C and 6 is within the scope of various embodiments.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to a memory cell. The memory cell includes a memory circuit and a multiplier circuit. The multiplier circuit includes an output node configured to output the output signal, a first transistor and an initialization circuit. The first transistor is coupled to the output node and the memory circuit, and is configured to receive at least the second signal. The initialization circuit is coupled to the first transistor by the output node, and is configured to initialize the multiplier circuit in response to at least a third signal or a fourth signal. The memory circuit is configured to store a first value of a first signal of a first storage node. The multiplier circuit is coupled to the memory circuit. The multiplier circuit is configured to generate an output signal in response to the first signal and a second signal. The output signal corresponds to a product of the first signal and the second signal.

Another aspect of this description relates to a memory cell. The memory cell includes a first set of memory circuits configured to store weight data, and a first set of multiplier circuits configured to perform CIM operations between the weight data and input data. In some embodiments, the each multiplier circuit of the first set of multiplier circuits corresponds to each memory circuit of the first set of memory circuits. In some embodiments, the first set of memory circuits includes a first memory circuit configured to store a first weight value of a first signal of a first storage node. In some embodiments, the first set of multiplier circuits includes a first multiplier circuit coupled to the first memory circuit. In some embodiments, the first multiplier circuit is configured to generate an output signal in response to the first signal and a second signal. In some embodiments, the output signal corresponds to a CIM product operation between the first signal and the second signal. In some embodiments, the first multiplier circuit includes a first output node configured to output the output signal, a first transistor coupled to the first output node and the first memory circuit, and being configured to receive at least the second signal, and an initialization circuit coupled to the first transistor by the first output node, and configured to initialize the first multiplier circuit in response to at least a third signal or a fourth signal.

Still another aspect of this description relates to a method of operating a memory cell. The method includes performing a write operation of the memory cell and performing, by a multiplier circuit, a computing-in memory (CIM) operation between the first signal and a second signal. In some embodiments, the memory cell includes a memory circuit and a multiplier circuit. In some embodiments, the performing the write operation of the memory cell includes storing a first value of a first signal in a first storage node of the memory circuit, where the first signal corresponds to a first weight. In some embodiments, the multiplier circuit includes a first transistor and an initialization circuit. In some embodiments, performing the CIM operation between the first signal and the second signal includes initializing, by the initialization circuit, an output signal of the multiplier circuit in response to at least a third signal or a fourth signal, and setting, by the first transistor, the output signal, during a sensing phase of the memory circuit, in response to at least the second signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
   a memory circuit configured to store a first value of a first signal of a first storage node;
   a multiplier circuit coupled to the memory circuit, the multiplier circuit being configured to generate an output signal in response to the first signal and a second signal, the output signal corresponding to a product of the first signal and the second signal, the multiplier circuit including:
      an output node configured to output the output signal;
      a first transistor coupled to the output node and the memory circuit, and being configured to receive at least the second signal; and
      an initialization circuit coupled to the first transistor by the output node, and being configured to initialize the multiplier circuit in response to at least a third signal or a fourth signal.

2. The memory cell of claim 1, wherein the initialization circuit configured to initialize the multiplier circuit comprises:
   the initialization circuit being further configured to set the output signal during an initialization phase of the memory circuit in response to at least the third signal or the fourth signal.

3. The memory cell of claim 2, wherein the initialization circuit comprises:
   a second transistor of a first type, the second transistor comprising:
      a first source/drain terminal coupled to the output node and the first transistor;
      a second source/drain terminal coupled to a reference voltage supply, the reference voltage supply having a reference voltage corresponding to the third signal; and
      a first gate terminal configured to receive the fourth signal.

4. The memory cell of claim 1, wherein the first transistor is further configured to set the output signal, during a sensing phase of the memory circuit, in response to at least the second signal.

5. The memory cell of claim 4, wherein the first transistor is a P-type transistor, and the first transistor comprises:
- a first source/drain terminal coupled to the output node and the initialization circuit;
- a second source/drain terminal configured to receive the second signal; and
- a first gate terminal coupled to a second storage node of the memory circuit, and being configured to receive a fifth signal from the memory circuit, the fifth signal corresponding to a voltage of the second storage node.

6. The memory cell of claim 5, wherein the fifth signal is inverted from the first signal.

7. The memory cell of claim 4, wherein the first transistor is an N-type transistor, and the first transistor comprises:
- a first source/drain terminal coupled to the output node and the initialization circuit;
- a second source/drain terminal configured to receive the second signal; and
- a first gate terminal coupled to the first storage node of the memory circuit, and being configured to receive the first signal from the memory circuit, the first signal corresponding to a voltage of the first storage node.

8. The memory cell of claim 1, wherein the memory cell corresponds to an 8-transistor (8T) static random access (SRAM) cell.

9. The memory cell of claim 1, wherein the memory circuit comprises:
- a first bit line;
- a second bit line;
- a first word line;
- a first cross-coupled inverter;
- a second cross-coupled inverter coupled to the first cross-coupled inverter;
- a first pass-gate transistor coupled to the first bit line, the first word line and the first cross-coupled inverter; and
- a second pass-gate transistor coupled to the second bit line, the first word line and the second cross-coupled inverter.

10. A memory cell array, comprising:
- a first set of memory circuits configured to store weight data, the first set of memory circuits including:
  - a first memory circuit configured to store a first weight value of a first signal of a first storage node;
- a first set of multiplier circuits configured to perform computing-in memory (CIM) operations between the weight data and input data, the first set of multiplier circuits including:
  - a first multiplier circuit coupled to the first memory circuit, the first multiplier circuit being configured to generate an output signal in response to the first signal and a second signal, the output signal corresponding to a CIM product operation between the first signal and the second signal, the first multiplier circuit including:
    - a first output node configured to output the output signal;
    - a first transistor coupled to the first output node and the first memory circuit, and being configured to receive at least the second signal; and
    - an initialization circuit coupled to the first transistor by the first output node, and being configured to initialize the first multiplier circuit in response to at least a third signal or a fourth signal,
- wherein each multiplier circuit of the first set of multiplier circuits corresponds to each memory circuit of the first set of memory circuits.

11. The memory cell array of claim 10, wherein the CIM product operation between the first signal and the second signal corresponds to an AND operation between the first signal and the second signal.

12. The memory cell array of claim 10, wherein the first transistor is further configured to set the output signal, during a sensing phase of the first memory circuit, in response to at least the second signal.

13. The memory cell array of claim 12, wherein the first transistor is an N-type transistor, and the first transistor comprises:
- a first source/drain terminal coupled to the first output node and the initialization circuit;
- a second source/drain terminal configured to receive the second signal; and
- a first gate terminal coupled to the first storage node of the first memory circuit, and being configured to receive the first signal from the first memory circuit, the first signal corresponding to a voltage of the first storage node.

14. The memory cell array of claim 12, wherein the first transistor is a P-type transistor, and the first transistor comprises:
- a first source/drain terminal coupled to the first output node and the initialization circuit;
- a second source/drain terminal configured to receive the second signal; and
- a first gate terminal coupled to a second storage node of the first memory circuit, and being configured to receive a fifth signal from the first memory circuit, the fifth signal corresponding to a voltage of the second storage node,
- wherein the fifth signal is inverted from the first signal.

15. The memory cell array of claim 10, wherein the initialization circuit configured to initialize the first multiplier circuit comprises:
- the initialization circuit being further configured to set the output signal during an initialization phase of the first memory circuit in response to at least the third signal or the fourth signal.

16. The memory cell array of claim 15, wherein the initialization circuit comprises:
- a second transistor of a first type, the second transistor comprising:
  - a first source/drain terminal coupled to the first output node and the first transistor;
  - a second source/drain terminal coupled to a reference voltage supply, the reference voltage supply having a reference voltage corresponding to the third signal; and
  - a first gate terminal configured to receive the fourth signal.

17. The memory cell array of claim 10, wherein the memory cell array corresponds to an array of 8-transistor (8T) static random access (SRAM) cells.

18. A method of operating a memory cell, the method comprising:
- performing a write operation of the memory cell, the memory cell including a memory circuit and a multiplier circuit, the performing the write operation of the memory cell comprising:
  - storing a first value of a first signal in a first storage node of the memory circuit, the first signal corresponding to a first weight;
- performing, by the multiplier circuit, a computing-in memory (CIM) operation between the first signal and a second signal, the multiplier circuit including a first transistor and an initialization circuit, wherein performing the CIM operation between the first signal and the second signal comprises:

initializing, by the initialization circuit, an output signal of the multiplier circuit in response to at least a third signal or a fourth signal; and setting, by the first transistor, the output signal, during a sensing phase of the memory circuit, in response to at least the second signal.

19. The method of claim 18, wherein initializing the output signal of the multiplier circuit comprises:

setting the second signal to an initialization value during an initialization phase of the memory circuit, the initialization circuit including a second transistor;

turning on the second transistor in response to the third signal, thereby electrically coupling a first node of the multiplier circuit to an output node of the multiplier circuit; and setting a value of the output signal to be equal to a value of the fourth signal.

20. The method of claim 19, wherein setting the output signal, during the sensing phase of the memory circuit, comprises:

turning off the second transistor in response to the third signal, thereby electrically decoupling the first node and the output node from each other;

setting the second signal to a non-initialization value during the sensing phase of the memory circuit; and setting the value of the output signal in response to turning on or off the first transistor.

\* \* \* \* \*